US010790110B2

United States Patent
Ogasawara

(10) Patent No.: US 10,790,110 B2
(45) Date of Patent: Sep. 29, 2020

(54) CHARGED PARTICLE BEAM IRRADIATION APPARATUS, CHARGED PARTICLE BEAM IMAGE ACQUISITION APPARATUS, AND CHARGED PARTICLE BEAM INSPECTION APPARATUS

(71) Applicant: NUFLARE TECHNOLOGY, INC., Kanagawa (JP)

(72) Inventor: Munehiro Ogasawara, Hiratsuka (JP)

(73) Assignee: NUFLARE TECHNOLOGY, INC., Kanagawa (JP)

(*) Notice: Subject to any disclaimer, the term of this patent is extended or adjusted under 35 U.S.C. 154(b) by 88 days.

(21) Appl. No.: 16/356,610

(22) Filed: Mar. 18, 2019

(65) Prior Publication Data
US 2019/0304737 A1    Oct. 3, 2019

(30) Foreign Application Priority Data
Mar. 29, 2018    (JP) ................. 2018-064445

(51) Int. Cl.
*H01J 37/20*    (2006.01)
*H01J 37/244*    (2006.01)
(Continued)

(52) U.S. Cl.
CPC .......... *H01J 37/026* (2013.01); *H01J 37/141* (2013.01); *H01J 37/20* (2013.01); *H01J 37/226* (2013.01);
(Continued)

(58) Field of Classification Search
CPC ......... H01J 2237/2448; H01J 2237/006; H01J 2237/06366; H01J 2237/31798;
(Continued)

(56) References Cited

U.S. PATENT DOCUMENTS

| 5,462,629 A * | 10/1995 | Kubota ............... H01J 37/3053 156/345.55 |
| 5,767,512 A * | 6/1998 | Eiden .................... H01J 49/145 250/282 |
| 5,939,026 A * | 8/1999 | Seki ..................... B01D 53/323 204/157.15 |
| 6,259,091 B1 * | 7/2001 | Eiden .................. H01J 49/0077 250/281 |

(Continued)

FOREIGN PATENT DOCUMENTS

| JP | 2001-236914 A | 8/2001 |
| JP | 2002-231172 A | 8/2002 |

(Continued)

*Primary Examiner* — David A Vanore
(74) *Attorney, Agent, or Firm* — Cermak Nakajima & McGowan LLP; Tomoko Nakajima

(57) ABSTRACT

According to one aspect of the present invention, a charged particle beam irradiation apparatus includes an electromagnetic lens configured to refract the charged particle beam; a plurality of electrodes arranged in a magnetic field of the electromagnetic lens and arranged to surround an outer space of a passage region of the charged particle beam; a supply mechanism configured to supply a gas to the space surrounded by the plurality of electrodes; a potential control circuit configured to control potentials of the plurality of electrodes so that a plasma is generated in the space surrounded by the plurality of electrodes and movements of electrons or positive ions generated by the plasma are controlled; and a stage configured to dispose a substrate irradiated with a charged particle beam passing through the electromagnetic lens, wherein the substrate is irradiated with light radiated by the plasma.

10 Claims, 15 Drawing Sheets

(51) Int. Cl.
  *H01J 37/02* (2006.01)
  *H01J 37/141* (2006.01)
  *H01J 37/22* (2006.01)
  *H05G 2/00* (2006.01)

(52) U.S. Cl.
  CPC .......... *H01J 37/244* (2013.01); *H05G 2/001* (2013.01); *H01J 2237/0047* (2013.01); *H01J 2237/1405* (2013.01); *H01J 2237/2448* (2013.01)

(58) Field of Classification Search
  CPC ........ H01J 37/10; H01J 37/141; H01J 37/226; H01J 37/30; H01J 37/32055; H01J 37/32412; H01J 49/0054; H01J 49/0077; H05H 1/24; H05H 2001/4645; H05H 2001/481
  USPC ..... 250/281, 282, 288, 307, 396 R, 396 ML, 250/305, 306, 309, 310, 397, 492.3, 250/423 R, 201.2, 251
  See application file for complete search history.

(56) References Cited

U.S. PATENT DOCUMENTS

| | | | |
|---|---|---|---|
| 9,873,941 B2* | 1/2018 | Ito | C23C 16/45557 |
| 10,325,755 B2* | 6/2019 | Wake | H01J 37/3056 |
| 2005/0279934 A1* | 12/2005 | Stewart | H01J 37/244 |
| | | | 250/310 |
| 2011/0084207 A1* | 4/2011 | Zhang | H01J 37/3005 |
| | | | 250/307 |
| 2013/0134307 A1* | 5/2013 | Routh, Jr. | H01J 37/10 |
| | | | 250/305 |
| 2013/0287963 A1* | 10/2013 | Radovanov | H01J 37/32357 |
| | | | 427/523 |
| 2014/0034484 A1* | 2/2014 | Fisk | H01J 37/3266 |
| | | | 204/192.38 |
| 2015/0122985 A1* | 5/2015 | Ristroph | H01J 49/0054 |
| | | | 250/282 |
| 2019/0304737 A1* | 10/2019 | Ogasawara | H01J 37/226 |

FOREIGN PATENT DOCUMENTS

| | | |
|---|---|---|
| JP | 2007-149449 A | 6/2007 |
| JP | 2009-004114 A | 1/2009 |
| JP | 6480534 B1 | 2/2019 |

* cited by examiner

CHARGED PARTICLE BEAM IRRADIATION APPARATUS, CHARGED PARTICLE BEAM IMAGE ACQUISITION APPARATUS, AND CHARGED PARTICLE BEAM INSPECTION APPARATUS

CROSS-REFERENCE TO RELATED APPLICATION

This application is based upon and claims the benefit of priority from prior Japanese Patent Application No. 2018-064445 filed on Mar. 29, 2018 in Japan, the entire contents of which are incorporated herein by reference.

BACKGROUND OF THE INVENTION

Field of the Invention

The present invention relates to a charged particle beam irradiation apparatus, a charged particle beam image acquisition apparatus, and a charged particle beam inspection apparatus. For example, the invention relates to a technique of reducing charging generated in a substrate by the irradiation of an electron beam.

Related Art

In recent years, a dimension to be detected as a pattern defect becomes extremely small with the miniaturization of an LSI pattern size formed on a semiconductor wafer. Thus, it is necessary to improve the accuracy of a pattern inspection apparatus for inspecting a defect of an ultrafine pattern transferred to the semiconductor wafer.

As an inspection technique, there is known an inspection method which is performed by comparing a measurement image obtained by capturing a pattern formed on a substrate such as a semiconductor wafer or a lithography mask, design data, or a measurement image obtained by capturing the same pattern on the substrate. For example, as a pattern inspection method, there is known a "die to die (die-die) inspection method" which compares measurement image data obtained by capturing the same pattern at different places on the same substrate or a "die to database (die-database) inspection method" which generates design image data (reference image) on the basis of pattern design data and compares the design image data with a measurement image corresponding to measurement data obtained by capturing a pattern. In the inspection method of such an inspection apparatus, an inspection target substrate is placed on a stage and a light flux scans a target object with the movement of the stage so that the target object is inspected. The inspection target substrate is irradiated with a light flux by a light source and an illumination optics. Light transmitted through or reflected from the inspection target substrate forms an image on a sensor through an optics. An image captured by the sensor is transmitted to a comparison circuit as measurement data. In the comparison circuit, the measurement data and the reference data are compared according to an appropriate algorithm after aligning the images. Then, when both data do not match, it is determined that a pattern defect exists.

In the above-described pattern inspection apparatus, the inspection target substrate is irradiated with a laser beam and a transmission image or a reflection image is captured to acquire an optical image. In contrast, an inspection apparatus which scans an inspection target substrate by an electron beam, detects a secondary electron emitted from the inspection target substrate in accordance with the irradiation of the electron beam, and acquires a pattern image is also being developed. In such an apparatus, a problem arises in that an upper surface of the substrate is charged by the irradiation of an electron beam to the substrate. Charging of the substrate surface causes degradation of inspection accuracy. For that reason, a method of flowing an ion gas for neutralization onto the substrate has been examined in order to eliminate such charging. For example, a structure in which an ion/plasma generation device for supplying an ion gas is disposed in a chamber of a scanning electron microscope (SEM) is disclosed (for example, see JP-A-2007-149449). Such a problem can also arise in this way in an apparatus that acquires an image by using multiple beams in addition to an apparatus such as a scanning electron microscope (SEM) that acquires an image by using a single beam. In addition, the same problem also arises in an apparatus such as an electron beam lithography apparatus that irradiates a target object with an electron beam. However, when an ion generation device is disposed in the vicinity of an apparatus that emits, for example, an electron beam or inside the apparatus, the apparatus greatly increases in size. Further, in a case in which such an ion generation device generates a magnetic field, there is a possibility that a magnetic field generated by an electromagnetic lens constituting an electron beam optics of an electron beam inspection apparatus may be influenced.

BRIEF SUMMARY OF THE INVENTION

According to one aspect of the present invention, a charged particle beam irradiation apparatus includes:
an emission source configured to emit a charged particle beam;
an electromagnetic lens configured to refract the charged particle beam;
a plurality of electrodes arranged in a magnetic field of the electromagnetic lens and arranged to surround an outer space of a passage region of the charged particle beam;
a supply mechanism configured to supply a gas to the space surrounded by the plurality of electrodes;
a potential control circuit configured to control potentials of the plurality of electrodes so that a plasma is generated in the space surrounded by the plurality of electrodes and movements of electrons or positive ions generated by the plasma are controlled; and
a stage configured to dispose a substrate irradiated with a charged particle beam passing through the electromagnetic lens,
wherein the substrate is irradiated with light radiated by the plasma.

According to another aspect of the present invention, a charged particle beam image acquisition apparatus includes:
an emission source configured to emit a charged particle beam;
a stage configured to dispose a substrate thereon;
an electromagnetic lens configured to refract the charged particle beam;
a plurality of electrodes arranged in a magnetic field of the electromagnetic lens and arranged to surround an outer space of a passage region of the charged particle beam;
a supply mechanism configured to supply a gas to the space surrounded by the plurality of electrodes;
a potential control circuit configured to control potentials of the plurality of electrodes so that a plasma is generated in the space surrounded by the plurality of electrodes and movements of electrons or positive ions generated by the plasma are controlled; and
a detector configured to detect a secondary electron beam emitted from the substrate due to an irradiation of the charged particle beam passing through the electromagnetic lens while the substrate is irradiated with light radiated by the plasma.

According to yet another aspect of the present invention, a charged particle beam inspection apparatus includes:

an emission source configured to emit a charged particle beam;

a stage configured to dispose a substrate thereon;

an electromagnetic lens configured to refract the charged particle beam;

a plurality of electrodes arranged in a magnetic field of the electromagnetic lens and arranged to surround an outer space of a passage region of the charged particle beam;

a supply mechanism configured to supply a gas to the space surrounded by the plurality of electrodes;

a potential control circuit configured to control potentials of the plurality of electrodes so that a plasma is generated in the space surrounded by the plurality of electrodes and movements of electrons or positive ions generated by the plasma are controlled;

a detector configured to detect a secondary electron beam emitted from the substrate due to an irradiation of the charged particle beam passing through the electromagnetic lens while the substrate is irradiated with light radiated by the plasma; and a comparison circuit configured to compare a secondary electron image obtained by a detected secondary electron beam with a reference image.

DETAILED DESCRIPTION OF THE INVENTION

Hereinafter, embodiments will describe an apparatus capable of reducing charging without influencing a magnetic field generated by an electromagnetic lens constituting a charged particle beam optics of an apparatus emitting a charged particle beam.

Further, embodiments below will describe a configuration using an electron beam as an example of a charged particle beam. Here, a charged particle beam is not limited to an electron beam, but may be a beam using a charged particle beam such as an ion beam. Further, the charged particle beam may correspond to a case of using a single beam or multiple beams. Further, an electron beam inspection apparatus will be described as an example of a charged particle beam irradiation apparatus. Here, the charged particle beam irradiation apparatus is not limited to the inspection apparatus, but may be, for example, an apparatus that emits a charged particle beam by using an electromagnetic lens such as an electron beam lithography apparatus in an optics. Further, as an example of the electron beam inspection apparatus, a multiple beam inspection apparatus which irradiates an inspection target substrate with multiple beams having an electron beam and captures a secondary electron image will be described.

Embodiment 1

Figure 1:
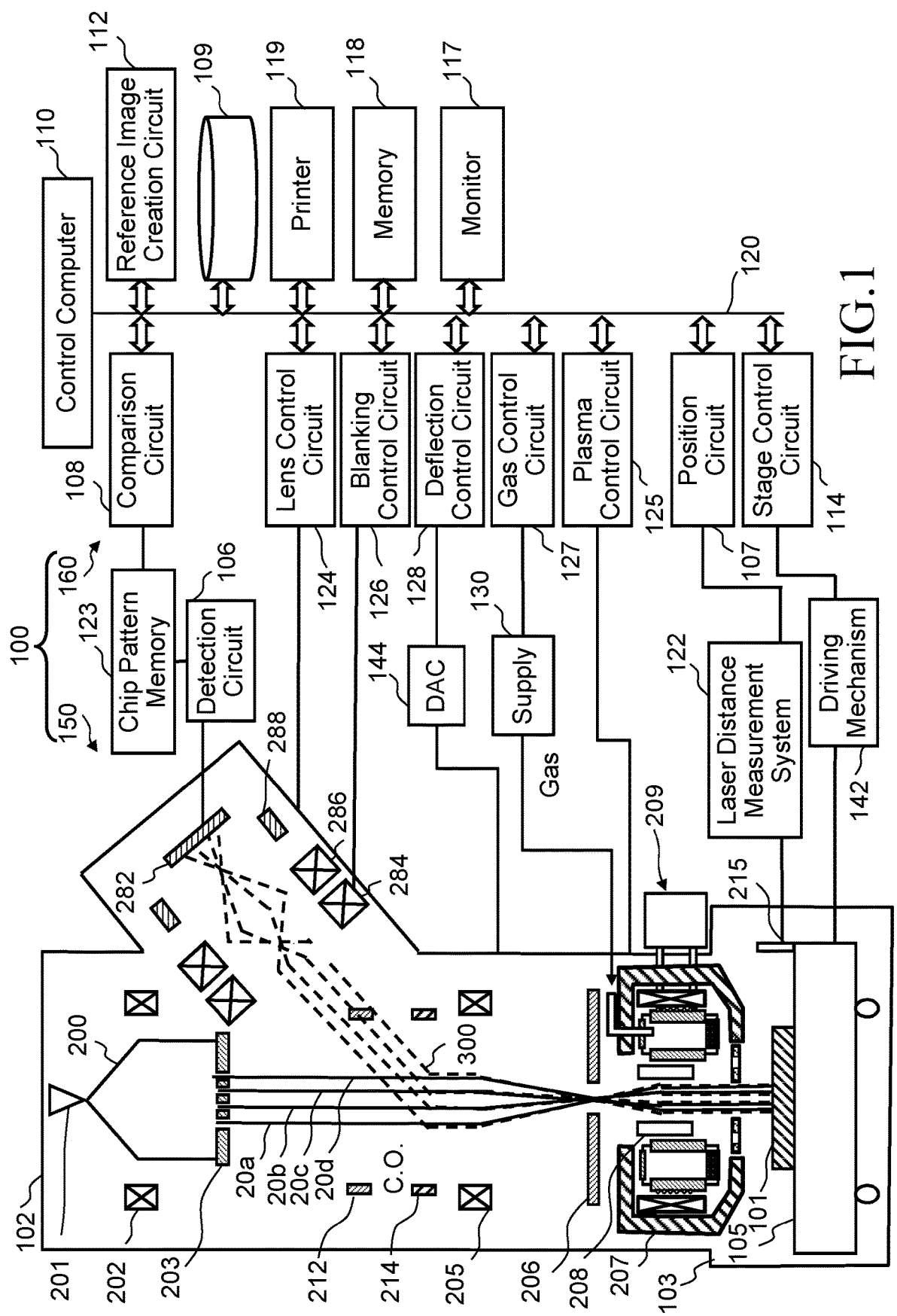
FIG. 1 is a configuration diagram illustrating a configuration of a pattern inspection apparatus of Embodiment 1.

FIG. 1 is a configuration diagram illustrating a configuration of a pattern inspection apparatus of Embodiment 1. In FIG. 1, an inspection apparatus 100 which inspects a pattern formed on a substrate is an example of an electron beam inspection apparatus. Further, the inspection apparatus 100 is an example of an electron beam irradiation apparatus. The inspection apparatus 100 includes an image acquisition mechanism 150, a control system circuit 160 (a control unit), and a gas supply device 130. The image acquisition mechanism 150 includes an electron beam column 102 (an electron optical column), an inspection room 103, a detection circuit 106, a chip pattern memory 123, a driving mechanism 142, and a laser distance measurement system 122. An electron gun assembly 201, an illumination lens 202, a shaping aperture array substrate 203, a reduction lens 205, a restriction aperture substrate 206, an objective lens 207, a deflector 208, a plasma generation mechanism 209, a collective blanking deflector 212, a beam separator 214, projection lenses 284 and 286, a deflector 288, and a multiple detector 282 are arranged in the electron beam column 102.

An XY stage 105 which is movable on at least XY plane is disposed in the inspection room 103. A substrate 101 which corresponds to an inspection target is disposed on the XY stage 105. The substrate 101 includes an exposure mask substrate and a semiconductor substrate such as a silicon wafer. In a case in which the substrate 101 is the semiconductor substrate, a plurality of chip patterns (wafer dies) are formed on the semiconductor substrate. In a case in which the substrate 101 is the exposure mask substrate, one chip pattern is generally formed on the exposure mask substrate. The chip pattern is formed by a plurality of figures. When the chip pattern formed on the exposure mask substrate is exposed and transferred to the semiconductor substrate a plurality of times, a plurality of chip patterns (wafer dies) are formed on the semiconductor substrate. Hereinafter, a case in which the substrate 101 is the semiconductor substrate will be mainly described. For example, the substrate 101 is disposed on the XY stage 105 so that a pattern formation surface faces upward. Further, a mirror 215 which reflects a laser beam for a laser distance measurement emitted from the laser distance measurement system 122 disposed outside the inspection room 103 is disposed on the XY stage 105. Further, the multiple detector 282 is connected to the detection circuit 106 at the outside of the electron beam column 102. The detection circuit 106 is connected to the chip pattern memory 123. Furthermore, the inside of the electron beam column 102 and the inspection room 103 becomes a vacuum state by a vacuum pump (not illustrated) and is maintained in a low-pressure state (a so-called vacuum state) sufficiently lower than the atmosphere.

Further, the plasma generation mechanism 209 which uses a magnetic field generated by the objective lens 207 is disposed in a pole piece of the objective lens 207.

In the control system circuit 160, a control computer 110 which controls the entire inspection apparatus 100 is connected to a position circuit 107, a comparison circuit 108, a reference image creation circuit 112, a stage control circuit 114, a lens control circuit 124, a plasma control circuit 125, a blanking control circuit 126, a gas control circuit 127, a deflection control circuit 128, a storage device 109 such as a magnetic disk drive, a monitor 117, a memory 118, and a printer 119 via a bus 120. Further, the deflection control circuit 128 is connected to a Digital to Analog Conversion (DAC) amplifier 144. The DAC amplifier 144 is connected to the deflector 208.

Further, the chip pattern memory 123 is connected to the comparison circuit 108. Further, the XY stage 105 is driven by the driving mechanism 142 under the control of the stage control circuit 114. In the driving mechanism 142, for example, a driving system such as a three-axis (X-Y-θ) motor driven in the x direction, the y direction, and the θ direction is provided and the XY stage 105 is movable. As the X, Y, and θ motors (not illustrated), for example, a stepping motor can be used. The XY stage 105 is movable in the horizontal direction and the rotation direction by the X, Y, and θ motors. Then, the movement position of the XY stage 105 is measured by the laser distance measurement system 122 and is supplied to the position circuit 107. The laser distance measurement system 122 measures the position of the XY stage 105 by the principle of the laser interference method by receiving the light reflected from the mirror 215.

A high voltage power supply circuit (not illustrated) is connected to the electron gun assembly 201 and an acceleration voltage is applied from the high voltage power supply circuit across a drawn electrode and a filament (not illustrated) inside the electron gun assembly 201. Then, an electron group discharged from a cathode is accelerated by applying a voltage to a predetermined drawn electrode (Wehnelt) and heating the cathode at a predetermined temperature and is emitted as an electron beam 200. The illumination lens 202, the reduction lens 205, the objective lens 207, and the projection lenses 284 and 286 are configured as, for example, electromagnetic lenses and all of them are controlled by the lens control circuit 124. Further, the beam separator 214 is also controlled by the lens control circuit 124. Each of the collective blanking deflector 212 and the deflector 288 is formed as an electrode group of at least two poles and is controlled by the blanking control circuit 126. The deflector 208 is formed as an electrode group of at least four poles and the deflector 208 is controlled by the deflection control circuit 128 via the DAC amplifier 144 disposed in each electrode.

Here, a configuration necessary to describe Embodiment 1 is described in FIG. 1. Other configurations generally necessary in the inspection apparatus 100 may be provided.

Figure 2:
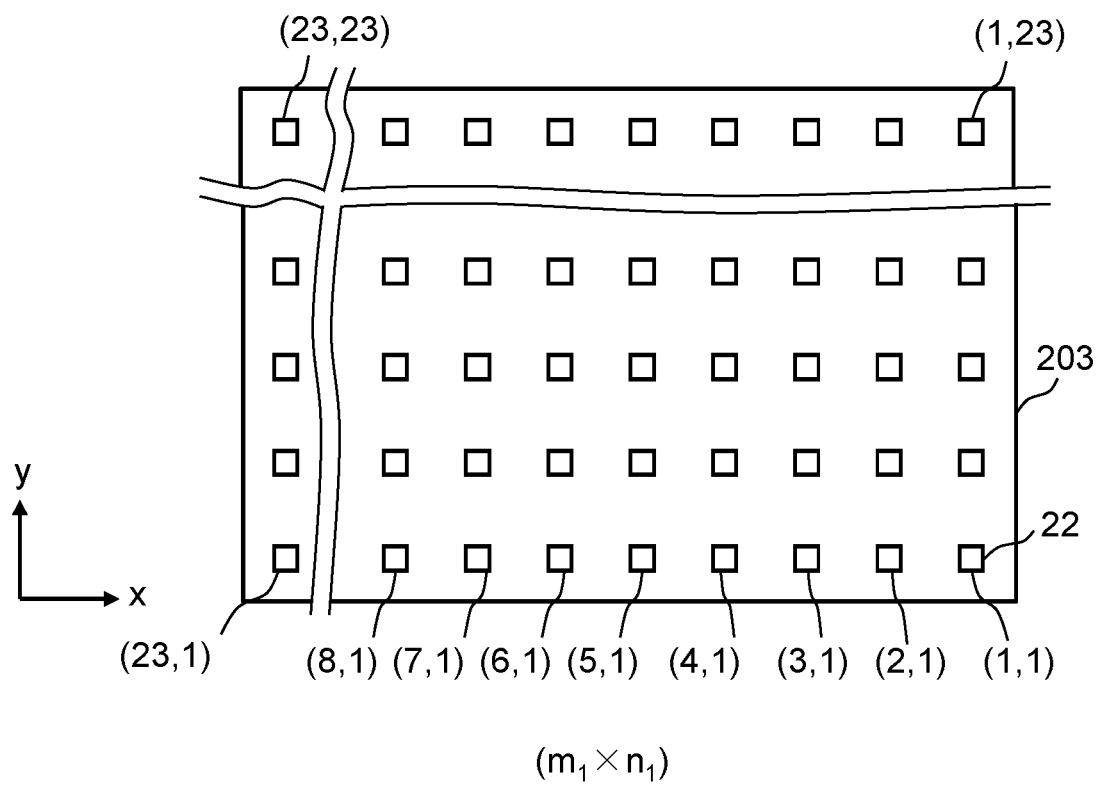
FIG. 2 is a conceptual diagram illustrating a configuration of a shaping aperture array substrate of Embodiment 1.

FIG. 2 is a conceptual diagram illustrating a configuration of a shaping aperture array substrate of Embodiment 1. As illustrated in FIG. 2, in the shaping aperture array substrate 203, holes (opening portions) 22 of $m_1$ rows in columns (the x direction)×$n_1$ stages in rows (the y direction) in two dimensions ($m_1$ and $n_1$ are integers of 2 or more) are formed at a predetermined arrangement pitch in the x and y directions. The example of FIG. 2 illustrates a case in which 23×23 holes (opening portions) 22 are formed. Each hole 22 is formed in a rectangular shape having the same dimension. Alternatively, these holes may be formed in a circular shape having the same outer diameter. When a part of the electron beam 200 respectively passes through these holes 22, multiple beams 20 are formed. Here, an example in which two rows or more holes 22 are arranged in the width and length directions (the x and y directions) is illustrated, but the invention is not limited thereto. For example, anyone of the width and length direction (the x and y directions) may have a plurality of rows and the other thereof may have only one row. Further, the method of arranging the holes 22 is not limited to a case in which the holes are arranged in a lattice shape in the width and length directions as illustrated in FIG. 2. For example, the hole of the k-th stage in row and the hole of the k+1-th stage in row in the length direction (the y direction) may be arranged to be deviated by a dimension a in the width direction (the x direction). Similarly, the hole of the k+1-th stage in row and the hole of the k+2-th stage in row in the length direction (the y direction) may be arranged to be deviated by a dimension b in the width direction (the x direction).

The image acquisition mechanism 150 acquires an inspection target image of the figure from the substrate 101 provided with the figure by using multiple beams 20 with the electron beam. Hereinafter, an operation of the image acquisition mechanism 150 of the inspection apparatus 100 will be described.

The electron beam 200 which is emitted from the electron gun assembly 201 (the emission source) illuminates the entire shaping aperture array substrate 203 in a substantially perpendicular direction by the illumination lens 202. As illustrated in FIG. 2, the shaping aperture array substrate 203 is provided with a plurality of rectangular holes 22 (opening portions) and the electron beam 200 illuminates a region including all of the plurality of holes 22. When a part of each electron beam 200 emitted to the positions of the plurality of holes 22 respectively pass through the plurality of holes 22 of the shaping aperture array substrate 203, for example, a plurality of electron beams (multiple beams) 20a to 20d having a rectangular shape (indicated by a solid line of FIG. 1) are formed.

Then, the formed multiple beams 20a to 20d form a crossover (C.O.), pass through beam separators 214 disposed at the crossover positions of respective beams of the multiple beams 20, are reduced in size by the reduction lens 205, and advance toward the center hole formed in the restriction aperture substrate 206. Here, when all of the multiple beams 20a to 20d are deflected together by the collective blanking deflector 212 disposed between the shaping aperture array substrate 203 and the reduction lens 205, the beams are deviated from the center hole of the restriction aperture substrate 206 and are blocked by the restriction aperture substrate 206. Meanwhile, the multiple beams 20a to 20d which are not deflected by the collective blanking deflector 212 pass through the center hole of the restriction aperture substrate 206 as illustrated in FIG. 1. The blanking control is performed by the ON/OFF operation of the collective blanking deflector 212 so that the beam ON/OFF state is controlled together. In this way, the restriction aperture substrate 206 blocks the multiple beams 20a to 20d which are deflected to become a beam OFF state by the collective blanking deflector 212. Then, the multiple beams 20a to 20d for inspection are formed by a beam group formed from the beam ON state to the beam OFF state and passing through the restriction aperture substrate 206. The multiple beams 20a to 20d passing through the restriction aperture substrate 206 are focused onto the surface of the target object 101 by the objective lens 207 to become a pattern image (a beam diameter) having a desired reduction ratio and all of the multiple beams 20 passing through the restriction aperture substrate 206 are deflected together in the same direction by the deflector 208 to be respectively irradiating the irradiation positions of the beams on the substrate 101. In Embodiment 1, a scanning operation is performed while the XY stage 105 is continuously moved. For this reason, the deflector 208 further performs tracking deflection so as to follow the movement of the XY stage 105. The multiple beams 20 which are emitted at one time are ideally arranged at a pitch obtained by multiplying the arrangement pitch of the plurality of holes 22 of the shaping aperture array substrate 203 by the desired reduction ratio (1/a). In this way, the electron beam column 102 irradiates the substrate 101 with the multiple beams 20 of $m_1 \times n_1$ in two dimensions at one time. Since a desired position of the substrate 101 is irradiated with the multiple beams 20, a secondary electron bundle (multiple secondary electron beams 300) (indicated by a dotted line in FIG. 1) including reflected electrons and corresponding each beam of the multiple beams 20 is emitted from the substrate 101.

The multiple secondary electron beams 300 which are emitted from the substrate 101 are refracted to the center side of the multiple secondary electron beams 300 by the objective lens 207 and advance toward the center hole formed in the restriction aperture substrate 206. The multiple secondary electron beams 300 passing through the restriction aperture substrate 206 are refracted to be substantially parallel to the optical axis by the reduction lens 205 and advance toward the beam separator 214.

Here, the beam separator 214 generates an electric field and a magnetic field in an orthogonal direction on a surface which is orthogonal to the advancing direction (the optical axis) of the multiple beams 20. The electric field exerts a force with respect to electrons in the same direction regardless of the advancing direction of electrons. In contrast, the magnetic field exerts a force with respect to electrons according to Fleming's left-hand rule. For this reason, it is possible to change the direction of the force acting on electrons by the penetration direction of electrons. In the multiple beams 20 (the primary electron beams) penetrating the beam separator 214 from above, a force caused by the electric field and a force caused by the magnetic field cancel each other and hence the multiple beams 20 advance straightly downward. In contrast, in the multiple secondary electron beams 300 permeating the beam separator 214 from below, a force caused by the electric field and a force caused by the magnetic field are exerted in the same direction and hence the multiple secondary electron beams 300 are bent obliquely upward.

The multiple secondary electron 300 which is obliquely bent upward is projected to the multiple detector 282 while being refracted by the projection lenses 284 and 286. The multiple detector 282 detects the projected multiple secondary electron 300. The multiple detector 282 includes, for example, a diode type two-dimensional sensor (not illustrated). Then, secondary electrons of the multiple secondary electron 300 collide with the diode type two-dimensional sensor so that electrons are generated and secondary electron image data is generated for each pixel to be described later. Further, since the scanning is performed while continuously moving the XY stage 105, the tracking deflection is performed as described above. In accordance with the movement of the deflection position due to the tracking deflection, the deflector 288 deflects the multiple secondary electron 300 to irradiating a desired position of the light receiving surface of the multiple detector 282.

Figure 3:
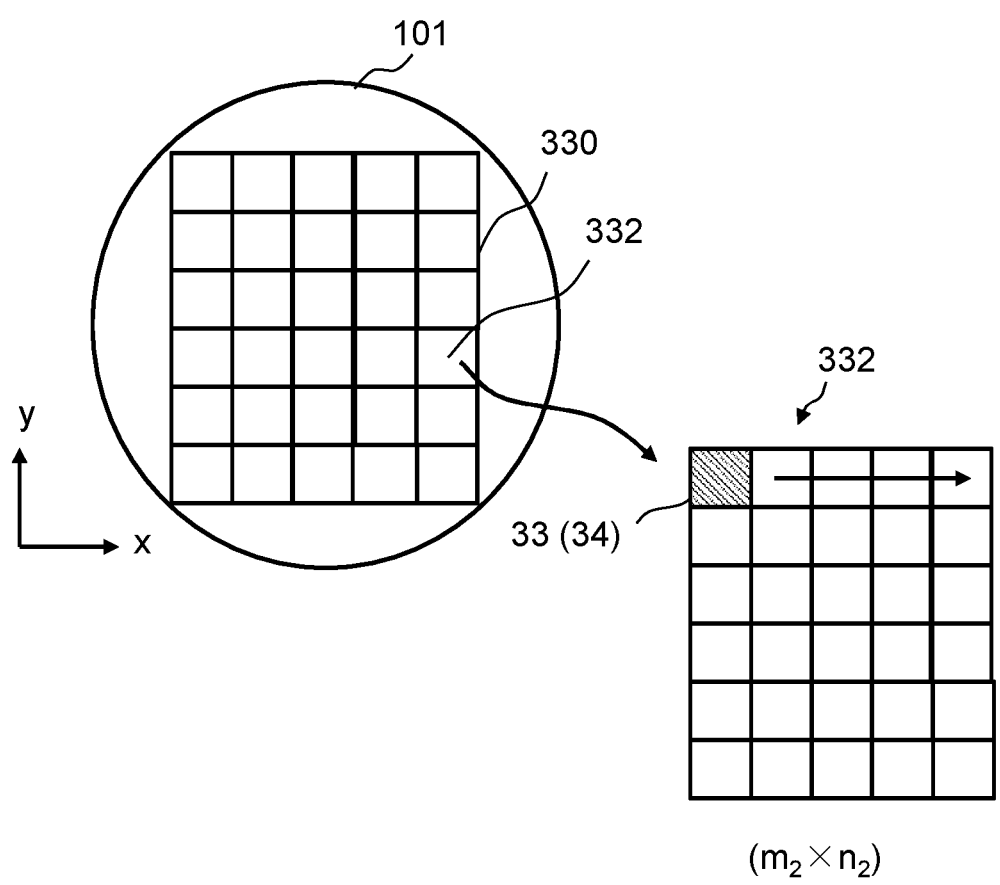
FIG. 3 is a diagram illustrating an example of a plurality of chip regions formed on a semiconductor substrate of Embodiment 1.

FIG. 3 is a diagram illustrating an example of a plurality of chip regions formed on a semiconductor substrate of Embodiment 1. In FIG. 3, when the substrate 101 is a semiconductor substrate (wafer), a plurality of chips (wafer dies) 332 are formed in a two-dimensional array shape on an inspection region 330 of the semiconductor substrate (wafer). A mask pattern for one chip formed on the exposure mask substrate is reduced in size by, for example, ¼ and is transferred to each chip 332 by an exposure device (stepper) (not illustrated). The inside of each chip 332 is divided into, for example, a plurality of mask dies 33 of $m_2$ rows in columns (x direction)×$n_2$ stages in rows (y direction) in two dimensions (here, $m_2$ and $n_2$ are integers of 2 or more). In Embodiment 1, such a mask die 33 becomes a unit inspection region.

Figure 4:
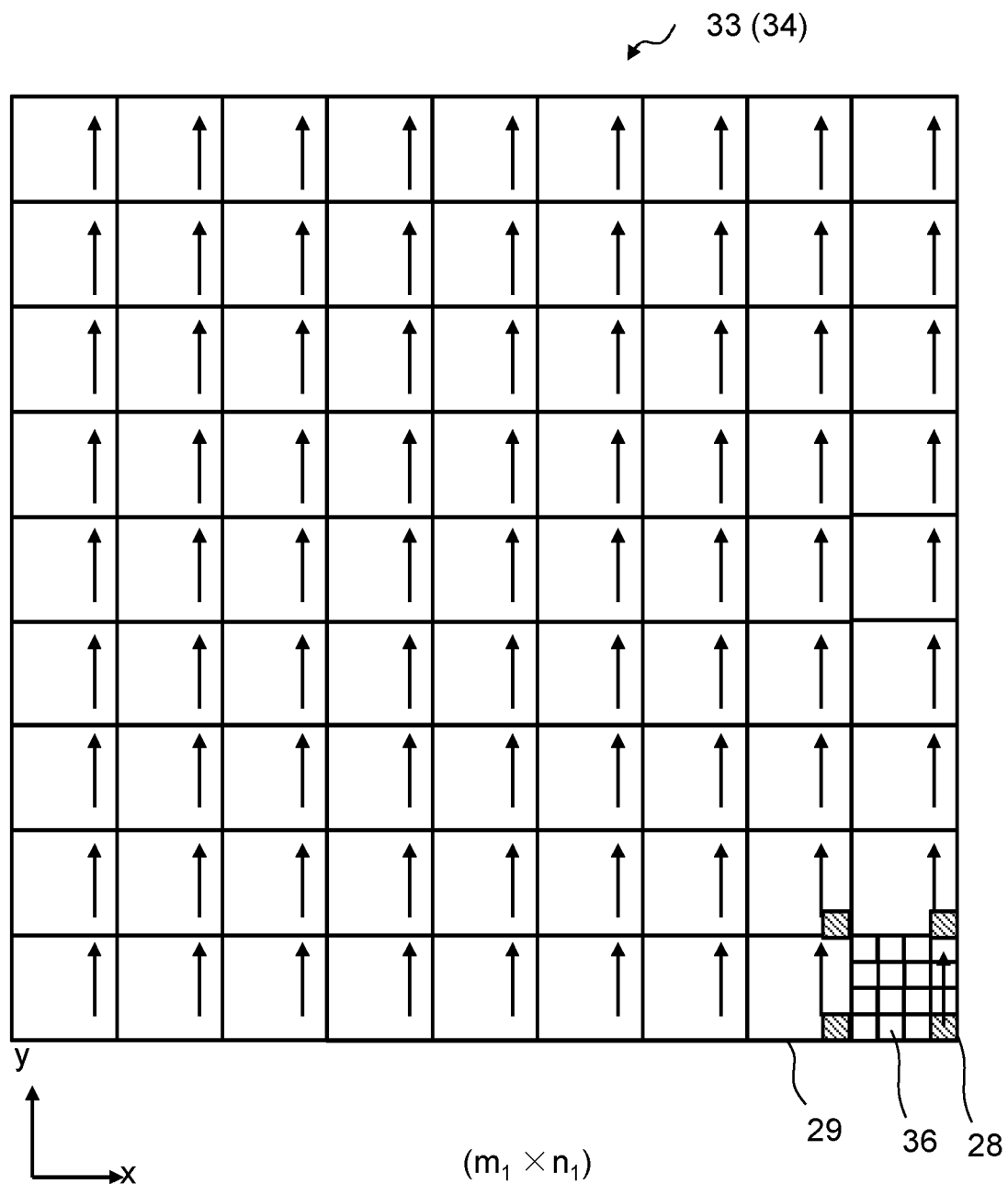
FIG. 4 is a diagram illustrating an example of a multiple beams irradiation region and a measurement pixel of Embodiment 1.

FIG. 4 is a diagram illustrating an example of a multiple beams irradiation region and a measurement pixel of Embodiment 1. In FIG. 4, each mask die 33 is divided into a plurality of mesh-shaped mesh regions with, for example, a beam size of multiple beams. Each of such mesh regions becomes a measurement pixel 36 (a unit irradiation region). The example of FIG. 4 illustrates a case of multiple beams of 8×8 rows. An irradiation region 34 which can be irradiated with one irradiation of the multiple beams 20 is defined by (the x-direction size obtained by multiplying the number of beams in the x direction by the pitch between the beams in the x direction of the multiple beams 20 on the surface of the substrate 101)×(the y-direction size obtained by multiplying the number of beams in the y direction by the pitch between the beams in the y direction of the multiple beams 20 on the surface of the substrate 101). The example of FIG. 4 illustrates a case in which the irradiation region 34 has the same size as that of the mask die 33. However, the invention is not limited thereto. The irradiation region 34 may be smaller or larger than the mask die 33. Then, a plurality of measurement pixels 28 (the irradiation positions of the beams at one shot) that can be irradiated with the multiple beams 20 once are illustrated in the irradiation region 34. In other words, a pitch between the adjacent measurement pixels 28 corresponds to a pitch between the beams of the multiple beams. In the example of FIG. 4, one sub-irradiation region 29 is formed by a square region surrounded by four adjacent measurement pixels 28 and including one measurement pixel 28 of four measurement pixels 28. The example of FIG. 4 illustrates a case in which each sub-irradiation region 29 is formed by 4×4 measurement pixels 36.

In the scanning operation of Embodiment 1, the scanning is performed for each mask die 33. The example of FIG. 4 illustrates an example of a case in which one certain mask die 33 is scanned. In a case in which all of the multiple beams 20 are used, the sub-irradiation regions 29 of $m_1 \times n_1$ are arranged in the x and y directions (in two dimensions) in one irradiation region 34. The XY stage 105 is moved to a position which can be irradiated with the multiple beams 20 in the first mask die 33. Then, the tracking deflection is performed by the deflector 208 in accordance with the movement of the XY stage 105 and the inside of the mask die 33 is scanned while using the mask die 33 as the irradiation region 34 in a tracking deflection state. Each beam constituting the multiple beams 20 is in charge of one of the mutually different sub-irradiation regions 29. Then, at each shot, one measurement pixel 28 corresponding to the same position in the assigned sub-irradiation region 29 is irradiated with each beam. In the example of FIG. 4, each beam is deflected by the deflector 208 to irradiating the first measurement pixel 36 from the right side of the lowest stage in the assigned sub-irradiation region 29 at a first shot. Then, the irradiation for the first shot is performed. Next, the beam deflection positions of all of the multiple beams 20 are collectively shifted by one measurement pixel 36 in the y direction by the deflector 208 and the first measurement pixel 36 from the right side of the second stage from the lower side in the assigned sub-irradiation region 29 is irradiated with the beam at a second shot. Similarly, the first measurement pixel 36 from the right side of the third stage from the lower side in the assigned sub-irradiation region 29 is irradiated with the beam at a third shot. Then, the first measurement pixel 36 from the right side of the fourth stage from the lower side in the assigned sub-irradiation region 29 is irradiated with the beam at a fourth shot. Next, the beam deflection positions of all of the multiple beams 20 are collectively shifted by the deflector 208 to the position of the second measurement pixel 36 from the right side of the lowest stage. Then, in the same way, the measurement pixel 36 in the y direction is sequentially irradiated with the beam. By repeating such an operation, all measurement pixels 36 in one sub-irradiation region 29 are sequentially irradiated with one beam. At one shot, the multiple secondary electron beams 300 corresponding to a plurality of beam shots as many as the holes 22 to maximum are detected at one time by the multiple beams formed while passing through the holes 22 of the shaping aperture array substrate 203.

As described above, the mask die 33 corresponding to the irradiation region 34 is scanned by all of the multiple beams 20, but each corresponding sub-irradiation region 29 is scanned by each beam. Then, when the scanning of one mask die 33 ends, the adjacent next mask die 33 moves to become the irradiation region 34 and then such an adjacent next mask die 33 is scanned. By repeating such an operation, the chips 332 are scanned. Whenever the multiple beams 20 are shot, secondary electrons are emitted from the irradiated measurement pixel 36 and are detected by the multiple detector 282. In Embodiment 1, the secondary electrons emitted upward from each measurement pixel 36 is detected by each measurement pixel 36 (or each sub-irradiation region 29) in the unit detection region size of the multiple detector 282.

As described above, when the scanning is performed by using the multiple beams 20, it is possible to perform the scanning operation (measurement) at a high speed as compared with the case of performing a scanning operation by a single beam. Furthermore, each mask die 33 may be scanned by a step-and-repeat operation or each mask die 33 may be scanned while continuously moving the XY stage 105. In a case in which the irradiation region 34 is smaller than the mask die 33, the scanning operation may be performed while moving the irradiation region 34 in the mask die 33.

In a case in which the substrate 101 is the exposure mask substrate, a chip region corresponding to one chip formed on the exposure mask substrate is divided into, for example, a plurality of stripe regions having a stripe shape with the size of the above-described mask die 33. Then, each mask die 33 may be scanned by the same scanning operation in each stripe region. Since the size of the mask die 33 of the exposure mask substrate is a size before the transferring operation, the size becomes four times the mask die 33 of the semiconductor substrate. For that reason, in a case in which the irradiation region 34 is smaller than the mask die 33 of the exposure mask substrate, the scanning operation increases by one chip (for example, four times). However, since a pattern corresponding to one chip is formed on the exposure mask substrate, the number of scanning may be smaller than that of the semiconductor substrate in which the number of chips formed thereon is larger than four chips.

As described above, the image acquisition mechanism 150 scans an inspection target substrate 101 provided with a figure by using the multiple beams 20 and detects the multiple secondary electron beams 300 emitted from the inspection target substrate 101 due to the irradiation of the multiple beams 20. The secondary electron detection data (measurement image, the secondary electron image, or the inspection target image) from each measurement pixel 36 detected by the multiple detector 282 is output to the detection circuit 106 according to a measurement sequence. In the detection circuit 106, analog detection data is converted into digital data by an A/D converter (not illustrated) and is stored in the chip pattern memory 123. In this way, the image acquisition mechanism 150 acquires the measurement image of the pattern formed on the substrate 101. Then, for example, the detection data of one chip 332 is transmitted to the comparison circuit 108 along with information indicating each position from the position circuit 107 as the chip pattern data at an accumulation stage.

The reference image creation circuit 112 creates a reference image for each mask die on the basis of the design data based on the pattern formed on the substrate 101 or the design pattern data defined by the exposure image data of the pattern formed on the substrate 101. Specifically, the operation is as follows. First, the design pattern data is read from the storage device 109 through the control computer 110 and each figure defined by the read design pattern data is converted into binary or multi-value image data.

Here, the figure defined by the design pattern data is, for example, a figure based on a rectangle or a triangle. For example, figure data defining a shape, a size, a position, and the like of each pattern figure defined by information such as a coordinate (x, y) at the reference position of the figure, a length of the side, and a figure code corresponding to an index for distinguishing the figure type such as a rectangle or a triangle is stored.

When the design pattern data corresponding to such figure data is input to the reference image creation circuit 112, the data expands to the figure data for each figure and a figure code, a figure dimension, and the like indicating the figure shape of the figure data are analyzed. Then, as a pattern to be arranged in a grid having a grid shape of a predetermined quantization dimension as a unit, binary or multi-value design pattern image data is expanded and output. In other words, the design data is read, an occupying ratio of the figure in the design pattern of each grid obtained by virtually dividing the inspection region as a grid having a unit of a predetermined dimension is calculated, and n-bit occupying ratio data is output. For example, it is preferable to set one grid as one pixel. Then, when one pixel has a resolution of $1/2^8$ ($=1/256$), a small region of $1/256$ corresponding to the region of the figure disposed in the pixel is allocated and an occupying ratio in the pixel is calculated. Then, the result is output as an 8-bit occupying ratio data to the reference image creation circuit 112. Such a grid (inspection pixel) may be aligned to the pixel of the measurement data.

Next, the reference image creation circuit 112 performs an appropriate filter process on design image data of the design pattern which is figure image data. Since the optical image data which is a measurement image is in a state in which a filter is operated by the optics, in other words, in a continuously changing analog state, the design image data corresponding to design image data in which the image intensity (gray value) is a digital value is subjected to a filter process to be adjusted to the measurement data. The image data of the created reference image is output to the comparison circuit 108 and is stored in a memory (not illustrated) in the comparison circuit 108.

Then, the comparison circuit 108 (the detector) inspects a pattern formed on the substrate 101 by using the information of the multiple secondary electron 300 detected by the multiple detector 282. Specifically, the operation is as below.

First, the comparison circuit 108 aligns a mask die image corresponding to an inspection target image to a mask die image corresponding to a reference image. For example, a position alignment is performed by using a least squares method. Here, as the inspection target image, for example, the mask die image is used.

Next, the comparison circuit 108 compares the measurement image measured from the substrate 101 with the corresponding reference image. Specifically, the inspection target image and the reference image which are aligned are compared with each other in each pixel. For example, it is determined whether a defect such as a shape defect exists by comparing both images in each pixel according to a predetermined determination condition using a predetermined determination threshold value. For example, when a gradation value difference for each pixel is larger than a determination threshold value Th, a defect candidate is determined. Then, a comparison result is output. The comparison result may be output to the storage device 109, the monitor 117, or the memory 118 or may be output from the printer 119.

In addition to the above-described die-database inspection, the die-die inspection may be performed. In a case in which the die-die inspection is performed, the measurement image data obtained by capturing the same pattern at different places on the same substrate 101 are compared with each other. For this reason, the image acquisition mechanism 150 acquires the measurement images which are secondary electron images of one figure (first figure) and the other figure (second figure) from the substrate 101 in which the same figures (first and second figures) are formed at different positions by using the multiple beams 20 (electron beam). In such a case, the acquired measurement image of one figure becomes the reference image and the measurement image of the other figure becomes the inspection target image. The acquired images of one figure (first figure) and the other figure (second figure) may exist in the same chip pattern data or may be divided to different chip pattern data. The inspection method may be the same as that of the die-database inspection.

As described above, in an apparatus that irradiates the substrate 101 with the same electron beam (here, the multiple beams 20) as that of the inspection apparatus 100, a problem arises in that the upper surface of the substrate 101 is charged by the irradiation of the electron beam to the substrate 101. The charging of the surface of the substrate 101 causes deterioration in inspection accuracy. For that reason, in order to eliminate such charging, in Embodiment 1, the surface of the charged substrate 101 is irradiated with VUV (vacuum ultraviolet) light or soft X-ray generated by plasma to eliminate charging.

Figure 5:
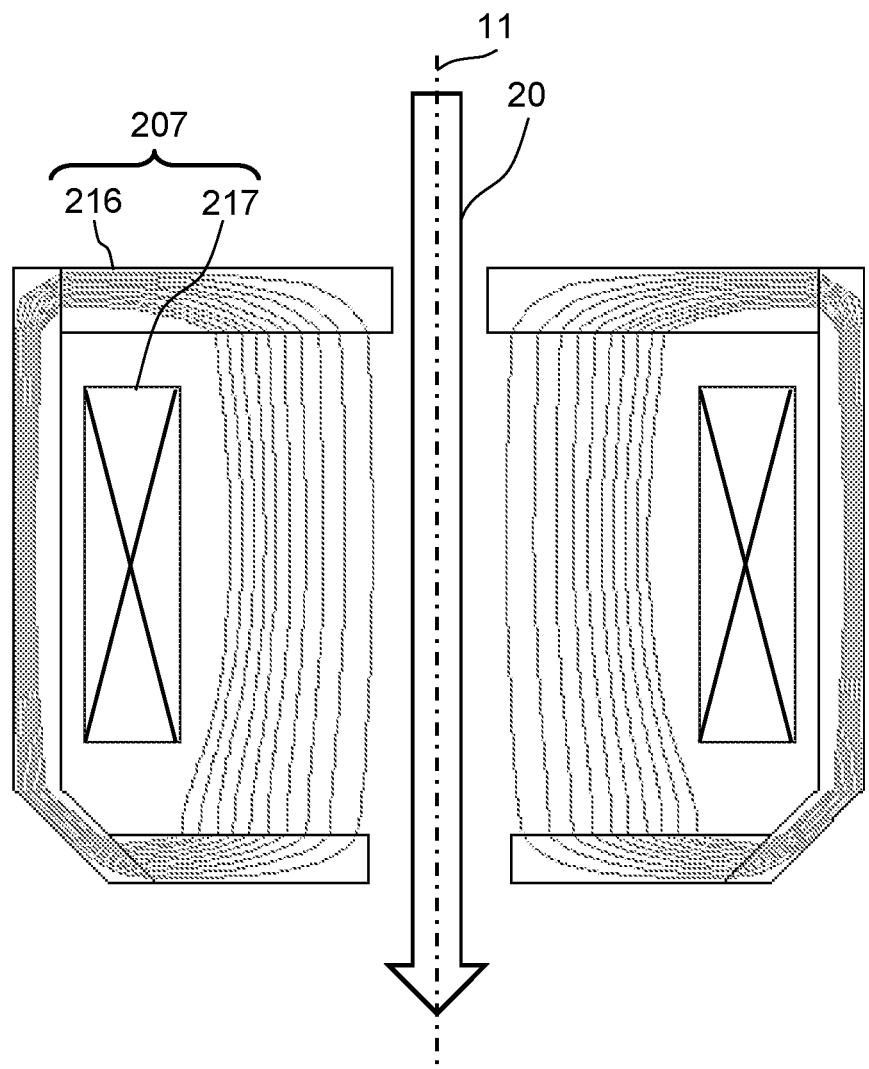
FIG. 5 is a diagram illustrating an example of a state of a magnetic field generated by an electromagnetic lens of Embodiment 1.

FIG. 5 is a diagram illustrating an example of a state of a magnetic field generated by an electromagnetic lens of Embodiment 1. Each of electromagnetic lenses such as an illumination lens 202, a reduction lens 205, and an objective lens 207 that refract the multiple beams 20 (or the electron beam 200) includes a coil which is disposed to surround an optical axis of the multiple beams 20 (or the electron beam 200) and a pole piece (a yoke) which surrounds the coil. Then, the pole piece (the yoke) is provided with an open portion (also referred to as a space or a gap) which leaks a high density magnetic field line formed by the coil to the optical axis of the multiple beams 20 (or the electron beam 200). Here, the objective lens 207 will be described as an example. In FIG. 5, the objective lens 207 includes a pole piece (yoke) 216 and a coil 217. The pole piece 216 is formed to be elongated in the vertical direction (to be elongated along the optical axis) and the coil 217 which is elongated in the vertical direction is disposed therein. The pole piece 216 is formed so that the center portions of the upper and lower surfaces are opened to secure the electron beam passage region and is formed in a shape opened toward the optical axis of the electron beam 200 (an opening portion is formed). The coil 217 is disposed at a position near the outer peripheral side of a space surrounded at the upper and lower surfaces and the outer peripheral surface by the pole piece 216 in three directions. When a current flows to the coil 217 in such a state, the coil 217 generates a magnetic field line in a space on the inside (the optical axis side) in relation to the coil 217 in the traveling direction of the multiple beams 20 (or the electron beam 200) (a downward direction in FIG. 5). In the example of FIG. 5, in the cross-section on the right hand side of the optical axis 11 of the multiple beams 20 (or the electron beam 200), the magnetic field line generated by the coil 217 rotates left inside the pole piece 216 by including the inside of the pole piece structure. Then, a loop of the magnetic field line traveling from the upper surface optical axis side end of the pole piece 216 to the lower surface optical axis side end through the optical axis side open space is formed. In contrast, in the cross-section on the left hand side of the optical axis 11 of the electron beam 200, the magnetic field line generated by the coil 217 rotates right inside the pole piece 216 by including the inside of the pole piece structure. Then, a loop of the magnetic field line traveling from the upper surface optical axis side end of the pole piece 216 to the lower surface optical axis side end through the optical axis side open space is formed. As described above, a magnetic field is generated in the space on the inside (the optical axis side) in relation to the coil 217 in the traveling direction of the multiple beams 20 (or the electron beam 200) (a downward direction in FIG. 5). Therefore, in Embodiment 1, when plasma is generated by using the magnetic field generated in the space on the inside (the optical axis side) in relation to such a coil 217, VUV (vacuum ultraviolet) light or soft X-ray is generated.

Figure 6:
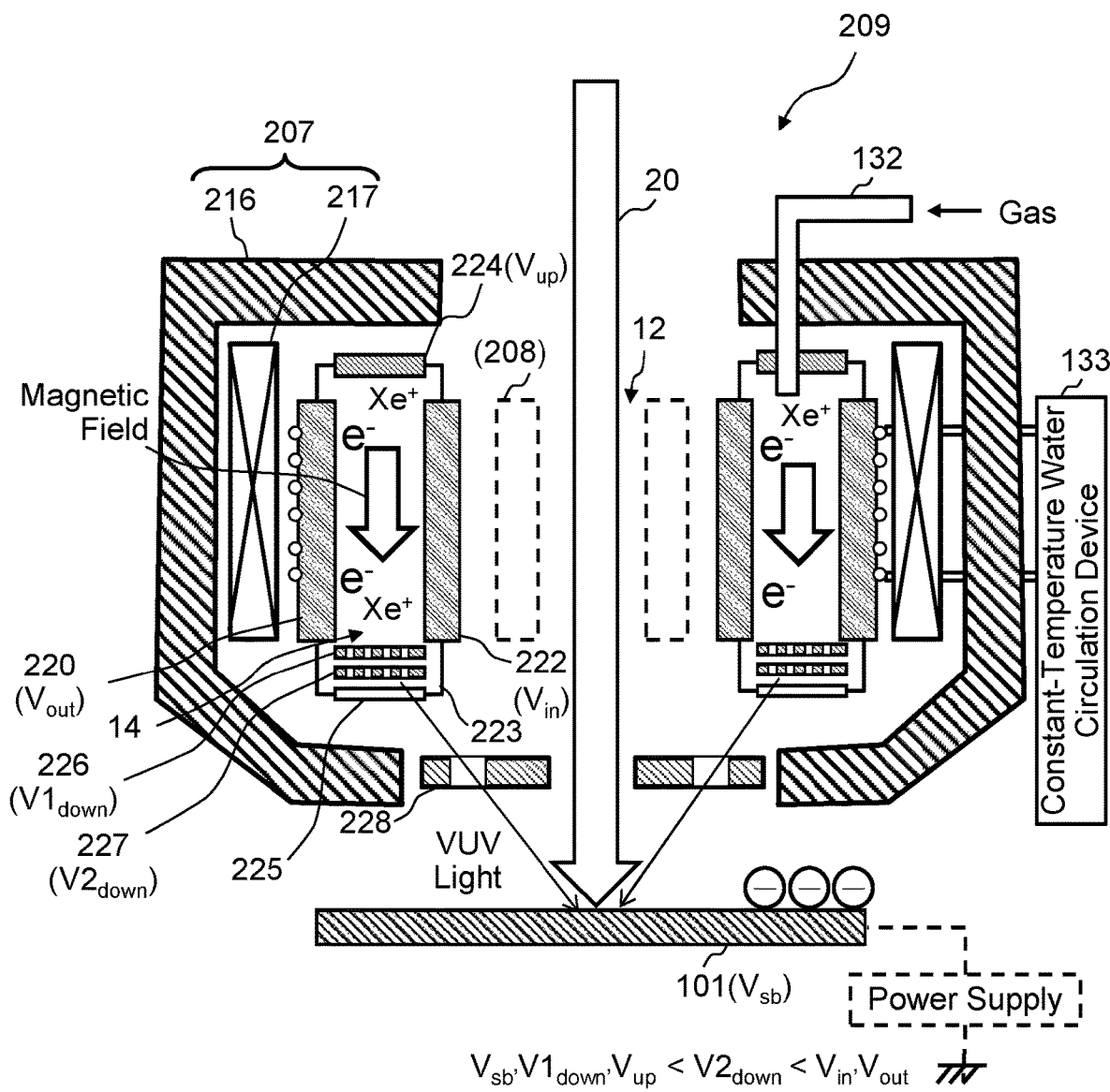
FIG. 6 is a cross-sectional view illustrating an example of a configuration of a plasma generation mechanism in an objective lens of Embodiment 1.

FIG. 6 is a cross-sectional view illustrating an example of a configuration of a plasma generation mechanism in an objective lens of Embodiment 1. In FIG. 6, the plasma generation mechanism 209 is disposed in the pole piece 216 of the objective lens 207. A plurality of electrodes such as an outer electrode 220, an inner electrode 222, an upper electrode 224, and lower electrodes 226 and 227 are disposed in the magnetic field of the objective lens 207 on the inside (the optical axis side) in relation to the coil 217 inside the pole piece 216. A transmission window 225 is disposed below two lower electrodes 226 and 227. As illustrated in FIG. 6, a plurality of electrodes such as the outer electrode 220, the inner electrode 222, the upper electrode 224, and the lower electrodes 226 and 227 are disposed to surround an outer space 14 of the passage region 12 of the multiple beams 20. Further, a gap formed among the outer electrode 220, the inner electrode 222, the upper electrode 224, and the transmission window 225 is sealed by a sealing wall 223 so that the space 14 surrounded by the outer electrode 220, the inner electrode 222, the upper electrode 224, and the transmission window 225 becomes a sealed space. As the sealing wall 223, for example, ceramic is preferably used. Furthermore, the space 14 which is sealed by the outer electrode 220, the inner electrode 222, the upper electrode 224, the transmission window 225, and the sealing wall 223 becomes a vacuum state by a vacuum pump (not illustrated) as in the inside of the electron beam column 102 and the inside of the inspection room 103.

Figure 7:
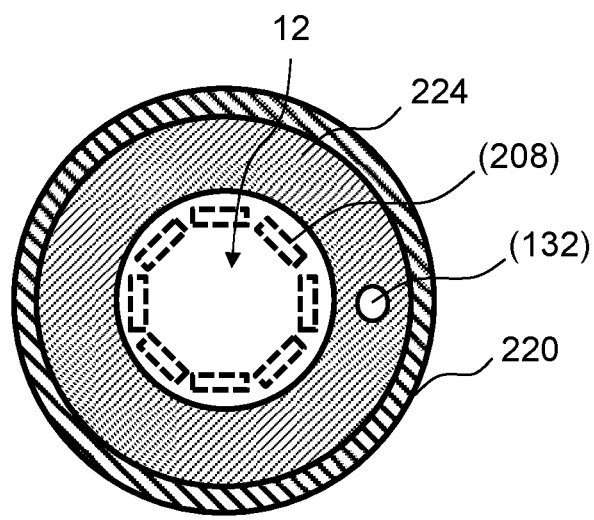
FIG. 7 is a plan view illustrating a state in which a plurality of electrodes are arranged in Embodiment 1 as viewed from above an upper electrode.

FIG. 7 is a plan view illustrating a state in which a plurality of electrodes are arranged in Embodiment 1 when viewed from above the upper electrode.

Figure 8:
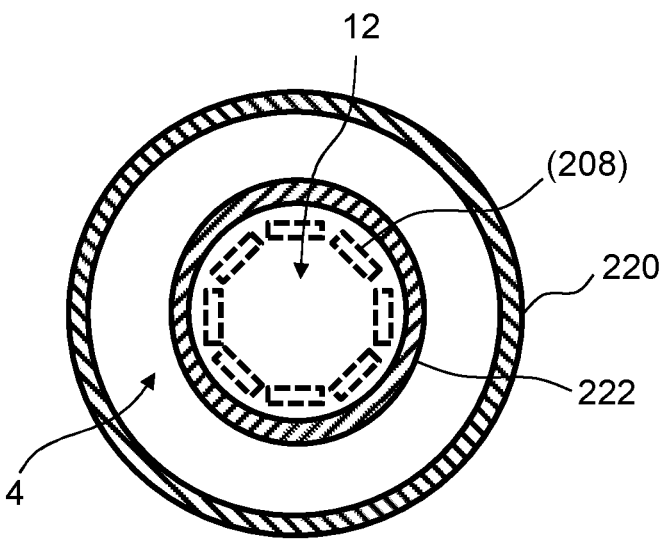
FIG. 8 is a plan view illustrating a state in which a plurality of electrodes are arranged in Embodiment 1 as viewed from an intermediate height position of an outer electrode.

FIG. 8 is a plan view illustrating a state in which a plurality of electrodes are arranged in Embodiment 1 when viewed from an intermediate height position of the outer electrode.

Figure 9:
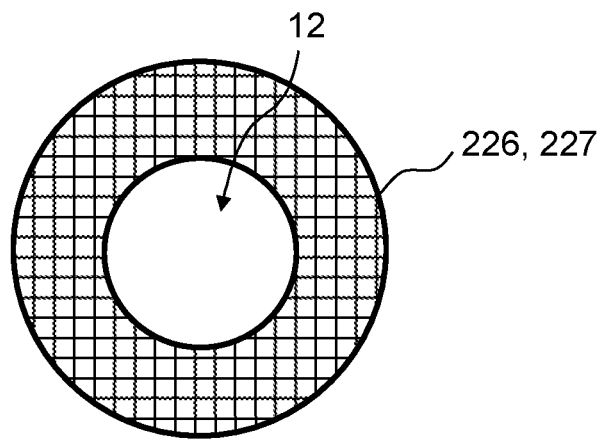
FIG. 9 is a plan view of a lower electrode of a plurality of electrodes in Embodiment 1.

FIG. 9 is a plan view of a lower electrode of the plurality of electrodes in Embodiment 1. As illustrated in FIGS. 7 to 9, the outer electrode 220 is formed in a cylindrical shape and is disposed to surround the outer peripheral surface of the inner electrode 222 which is also formed in a cylindrical shape. The height dimensions of the outer electrode 220 and the inner electrode 222 are formed in a size in which these electrodes can be disposed in a space between the upper and lower surface portions of the pole piece 216. The upper electrode 224 is formed in a disc shape of which a center portion is opened so that the multiple beams 20 pass therethrough and is disposed above the outer electrode 220 and the inner electrode 222 to cover the upper portion of the space 14 interposed between the outer electrode 220 and the inner electrode 222. The lower electrodes 226 and 227 are formed in a disc shape of which a center portion is opened so that the multiple beams 20 pass therethrough and are disposed below the outer electrode 220 and the inner electrode 222 to cover the lower portion of the space 14 interposed between the outer electrode 220 and the inner electrode 222. Here, the lower electrodes 226 and 227 are formed in, for example, a grid shape provided with a plurality of passage holes so that VUV light (or soft X-ray) generated by the plasma can pass through the lower electrodes 226 and 227. In other words, a grid structure is formed.

The outer electrode 220 and the inner electrode 222 are disposed in a space between the upper and lower surface portions of the pole piece 216. Alternatively, at least the outer electrode 220 is disposed in a space between the upper and lower surface portions of the pole piece 216 and the inner electrode 222 is disposed at a position on the inside (the optical axis side) in relation to the outer electrode 220 and the outside of the passage region 12 of the electron beam 200. In the example of FIG. 6, the inner electrode 222 is disposed at the outside of the deflector 208. The upper electrode 224 and the lower electrodes 226 and 227 are also disposed in a space between the upper and lower surface portions of the pole piece 216. Further, a gas supply line 132 (a supply unit) is formed to be connected to or to penetrate the upper electrode 224. Furthermore, in FIGS. 6 to 8, the deflector 208 which is not involved with the generation of the plasma is indicated by a dotted line. As the materials of the electrodes 220, 222, 224, 226, and 227, a material having less sputtering due to ion impact, for example, glassy carbon can be used.

Furthermore, since each electrode faces a high-temperature plasma, the heat inflow from the plasma becomes large depending on the condition of the plasma. Therefore, a cooling unit is provided. For example, a water-cooled pipe may be attached to the outside of the electrode and cooling water may be circulated through a constant-temperature water circulation device 133 through a pipe formed of an insulator. The same applies to the other embodiments.

The plasma control circuit 125 (the potential control unit) of Embodiment 1 controls the potentials of the plurality of electrodes so that a plasma is generated in the space 14 surrounded by a plurality of electrodes such as the outer electrode 220, the inner electrode 222, the upper electrode 224, and the lower electrodes 226 and 227 and the movement of electrons and positive ions generated by the plasma is controlled. Specifically, the operation is as below. By using the magnetic field of the objective lens 207 and the plurality of electrodes such as the outer electrode 220, the inner electrode 222, the upper electrode 224, and the lower electrode 226, a plasma is generated in the space 14 which is in a vacuum state and is surrounded by the outer electrode 220, the inner electrode 222, the upper electrode 224, and the lower electrode 226. Further, the gas supply line 132 (the supply unit) supplies a gas to a space surrounded by the plurality of electrodes 220, 222, 224, and 226 (or 227).

Such a plasma is generated by, for example, a Penning discharge. In a state in which a strong vertical magnetic field is generated by the objective lens 207 in the space 14 surrounded by the outer electrode 220, the inner electrode 222, the upper electrode 224, and the lower electrodes 226 and 227, the plasma control circuit 125 applies a potential Vout to the outer electrode 220 and applies a potential Vin to the inner electrode 222 while a predetermined gas flows from the gas supply line 132. In such a case, the same potential is applied as the potential Vout of the outer electrode 220 and the potential Vin of the inner electrode 222. When the potential Vout of the outer electrode 220 and the potential Vin of the inner electrode 222 become higher than the potentials of the upper electrode 224 and the lower electrode 226 by a predetermined potential, a plasma can be generated in the space 14 due to the Penning discharge. In the space in which five electrodes 220, 222, 224, 226, and 227 are disposed, since a gap is blocked by the sealing wall 223, air-tightness is maintained and the leakage of the gas supplied thereto from the space 14 can be prevented. This is effective for suppressing the gas supply amount. Further, it is possible to suppress a load of an exhaust system necessary for maintaining the vacuum state of the passage region of the multiple beams 20. Furthermore, for example, a vacuum exhaust pipe (not illustrated) is connected from the outside to a position in which the azimuthal position is different from that of the gas supply line 132 of the upper electrode 224 to evacuate the space 14. Further, it is effective to improve the controllability of the pressure of the space 14 by changing the exhaust speed of the vacuum exhaust pipe. In order to start the discharge with high efficiency, a material such as a tungsten filament that emits thermal electrons by heating is provided in the vicinity of the upper electrode 224. Then, when a current is supplied from an external power supply to that material to heat the material, it is possible to start the discharge by emitting electrons. Even if the filament current is stopped after the discharge starts normally, the discharge continues. It is also preferable to inject a high frequency wave into the plasma to assist a discharge.

Figure 10:
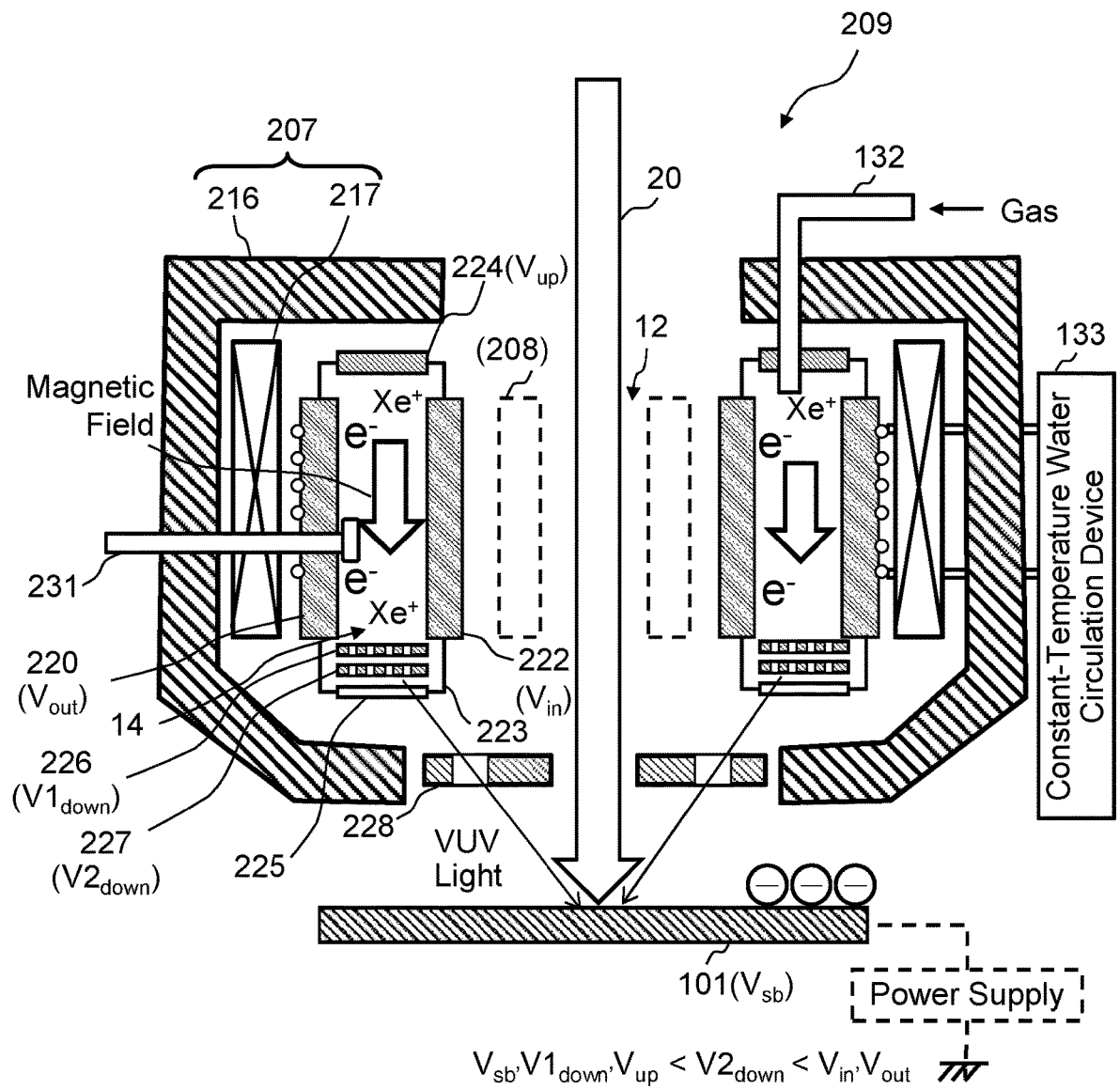
FIG. 10 is a cross-sectional view illustrating a modified example of a configuration of a plasma generation mechanism in an objective lens of Embodiment 1.

FIG. 10 is a cross-sectional view illustrating a modified example of a configuration of a plasma generation mechanism in an objective lens of Embodiment 1. FIG. 10 is the same as FIG. 6 except that a high frequency wave generation mechanism 231 is added. As in the modified example illustrated in FIG. 10, it is also preferable to generate a high frequency wave for heating the plasma in the space 14 by the high frequency wave generation mechanism 231. In such a case, the operation is specifically as below. The high frequency wave generation mechanism 231 leads a high frequency wave generated by a high frequency wave source disposed outside an optical column to a boundary of the space 14 using a coaxial waveguide and emits the high frequency wave to the space 14 using an antenna provided at the exit of the waveguide, for example, a loop antenna or a horn antenna to generate a plasma. The frequency of the microwave is, for example, an electron cyclotron frequency corresponding to the magnetic flux density in the vicinity of the center of the space 14 and the ionization phenomenon is promoted to generate a plasma by accelerating electrons by the electron cyclotron resonance phenomenon. The electron cyclotron frequency corresponding to the magnetic flux density 1 T is about 28 GHz. Further, it is effective for maintaining the discharge to continuously introduce the high frequency wave.

In the examples of FIGS. 6 and 10, the movement of electrons ($e^-$) in the space 14 in the radial direction is restricted by a strong vertical magnetic field generated by the objective lens 207. Further, when a potential Vup lower than the potential Vout and the potential Vin is applied to the upper electrode 224 and a potential V1down and a potential V2down lower than the potential Vout and the potential Vin are applied to the lower electrodes 226 and 227, the movement of electrons of the space 14 in the up and down direction is restricted. Due to the objective lens 207, for example, a magnetic field of 4 to 6 kG is generated. In such a magnetic field, a potential difference of Vin, Vout, Vup, V1down, and V2down is set such that Vin and Vout become higher by, for example, about 2 kV. As the potential Vout, for example, 2.1 kV is applied. As the potential Vin, for example, 2.1 kV which is the same potential as the potential Vout is applied. As the potential Vup, for example, 0 V is applied. As the potential V1down, for example, 0 V is applied. As the potential V2down, for example, +110 V is applied. The potential V1down and the potential V2down may be opposite to each other. The retarding electrode 228 is grounded. Due to this effect, trapped electrons ionize the gas molecules supplied from the gas supply line 132 to generate ions (for example, positive ions $Xe^+$). The lower electrode 226 is repelled by the potential V1down so that electrons trapped in the space 14 do not move toward the substrate 101. Further, the lower electrode 227 is repelled by the potential V2down so that the positive ions trapped in the space 14 do not move toward the substrate 101.

Meanwhile, light (VUV light or soft X-ray) radiated by the plasma generated in the space surrounded by the electrodes 220, 222, 224, and 226 (or 227) passes through the electrodes 226 and 227, is transmitted through the transmission window 225, and is emitted to the substrate 101 is irradiated with the light. In Embodiment 1, since the electrode 226 repels, for example, electrons and the electrode 227 repels, for example, positive ions, it is possible to prevent or reduce the collision of the electrons and the positive ions with respect to the transmission window 225 and hence to avoid or reduce the damage of the transmission window 225.

Here, as the gas supplied from the gas supply line 132, for example, a xenon (Xe) gas, a krypton (Kr) gas, an argon (Ar) gas, or the like can be preferably used. Due to the plasma generated when using these gases, VUV light is radiated. VUV light with a peak wavelength of 172 nm for an Xe gas, a peak wavelength of 145 nm for a Kr gas, and a peak wavelength of 126 nm for an Ar gas can be emitted. In a case in which such VUV light is emitted to the substrate 101, it is preferable to use, for example, magnesium fluoride (MgF), calcium fluoride ($CaF_2$), lithium fluoride (LiF), or the like as the material of the transmission window 225. Further, as the gas supplied from the gas supply line 132, for example, soft X-ray is emitted by a plasma generated when a deuterium gas is used. Soft X-ray with a peak wavelength of 115 nm can be emitted with a deuterium gas. In a case in which soft X-ray is emitted to the substrate 101, for example, it is preferable to use beryllium (Be) or the like as the material of the transmission window 225. In a case in which VUV light is generated, a temperature corresponding to about several eV is set. In a case in which soft X-ray is generated, a temperature corresponding to about several 100 eV is set. When light having such a short wavelength is emitted to the substrate 101, it is possible to reduce or eliminate the (positive or negative) charging of the surface of the substrate 101. To keep the plasma temperature high, high frequency wave which can cause the electron cyclotron resonance is continuously introduced.

The charging is eliminated by at least one or all of a case in which a plasma generated when gas molecules or atoms present near a target object surface are ionized by VUV (vacuum ultraviolet) light or soft X-ray contacts a target object surface charged portion, a case in which photoelectron is emitted from the surface of the substrate 101, and a case in which photoelectrons generated from peripheral members of the substrate 101 reaches the target object surface. As the peripheral member of the substrate 101, for example, the vicinity of the beam opening of the retarding electrode 228 is used so that photoelectrons generated by VUV light or soft X-ray reflected from the substrate 101 or VUV light or soft X-ray positively emitted to the substrate 101 may easily reach the vicinity of the beam irradiation position of the surface of the substrate 101. Parameters such as a discharge voltage, a gas pressure for generating a plasma, and a high frequency wave input power for additional heating are experimentally determined to obtain desired charging elimination efficiency by generated VUV light or soft X-rays. Since these parameters are different depending on a material of a target object, energy of incident electrons, a current, or the like, an optimal condition may be obtained in advance and may be selected in response to the measurement target object or the beam condition. Further, the gas pressure in the vicinity of the target object surface is set to a range in which degradation of beam resolution due to scattering of incident electrons by gas molecules does not matter.

Further, when a cleaning gas, for example, oxygen is supplied at the time of irradiating the peripheral member of the substrate 101 with VUV light or soft X-ray, it is possible to eliminate contaminants adhering to the surface of the peripheral member, for example, a material obtained from hydrocarbon by the function of atomic oxygen obtained by exciting oxygen molecules by VUV light or soft X-ray. At the time of cleaning, the electron beam 200 may be stopped and the cleaning gas pressure may be raised. Even in this case, the cleaning can be performed without disassembling the device.

It is preferable to provide a differential exhaust aperture between the electron gun assembly 201 and the inspection room 103 inside an optical column similarly to a method of suppressing an increase in pressure in the vicinity of the electron gun assembly 201 when a pressure in the vicinity of the substrate 101 becomes higher. Further, a configuration can be also employed in which a gate valve is provided at the downstream of the electron gun assembly 201, the gate valve is opened when irradiating the substrate 101 with the electron beam (multiple beams 20), and the gate valve is closed when stopping the irradiation of the electron beam (multiple beams 20) and introducing a cleaning gas so that the electron gun assembly 201 and the inspection room 103 are isolated from each other in a vacuum manner.

As described above, in Embodiment 1, when a plurality of electrodes such as the outer electrode 220, the inner electrode 222, the upper electrode 224, and the lower electrodes 226 and 227 are arranged in the magnetic field of the objective lens 207 and the potentials are respectively applied thereto, it is possible to generate a plasma in the space 14 surrounded by the plurality of electrodes and to radiate light in response to the supply of the gas. When short wavelength light generated by such a plasma is emitted to the substrate 101, it is possible to reduce (or eliminate) the charging of the substrate 101 without influencing the magnetic field and the electric field of the substrate 101.

Figure 11:
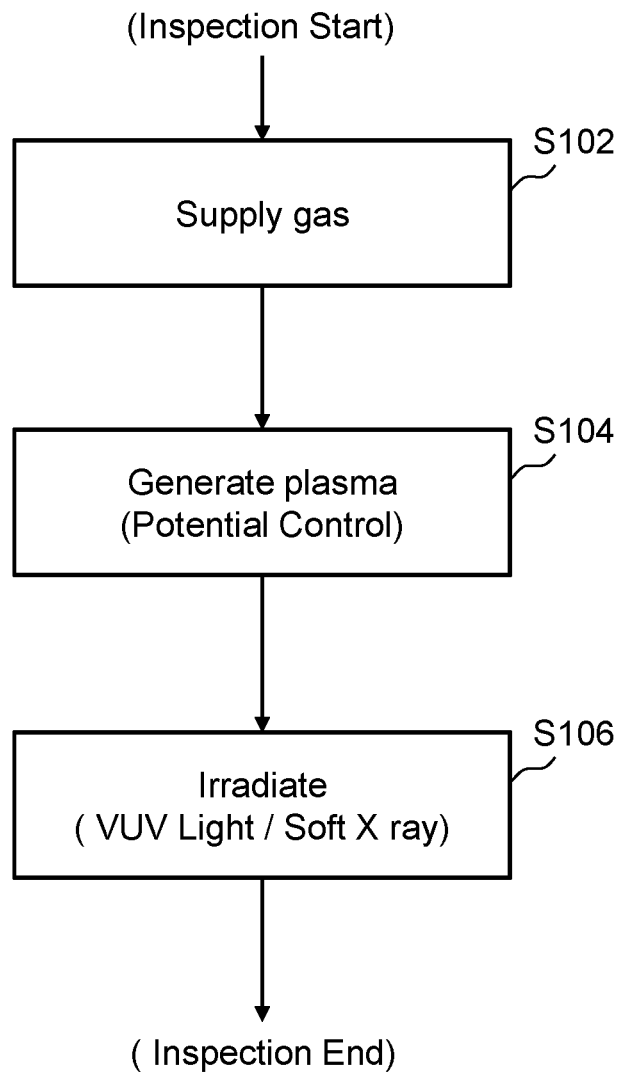
FIG. 11 is a flowchart illustrating main steps of a charging reduction method of Embodiment 1.

FIG. 11 is a flowchart illustrating main steps of a charging reduction method of Embodiment 1. In FIG. 11, the charging reduction method of Embodiment 1 performs a series of steps including a gas supply step (S102), a plasma generation step (S104), and an irradiation step (S106). Furthermore, FIG. 11 illustrates a case in which a series of steps are performed after an inspection starts, but the invention is not limited thereto. However, the steps may be performed before the inspection starts or after the inspection ends. Alternatively, the steps may be performed while the inspection process is stopped during the inspection process or may be performed while the inspection process is stopped during the movement between the inspection regions. Further, the gas supply and the plasma generation may be continuously performed to control the light emission amount.

As the gas supply step (S102), the gas supply device 130 supplies a gas to the electromagnetic lens (for example, the objective lens 207) through the gas supply line 132 under the control of the gas control circuit 127. Furthermore, as described above, the gas supply device 130 (the supply unit) supplies a gas to a plasma space through the gas supply line 132.

As the plasma generation step (S104), the plasma control circuit 125 controls the potentials of a plurality of electrodes such as the outer electrode 220, the inner electrode 222, the upper electrode 224, and the lower electrodes 226 and 227 disposed in the magnetic field of the objective lens 207 focusing the electron beam 200 to the surface of the substrate 101 and disposed to surround the outer space 14 of the passage region 12 of the electron beam 200 so that a plasma is generated in the space 14 surrounded by such a plurality of electrodes and the movement of positive ions or electrons and negative ions generated by the plasma is controlled. Specifically, the plasma control circuit 125 applies the potential Vout to the outer electrode 220 and applies the potential Vin which is the same potential as the potential Vout to the inner electrode 222. Then, the potential Vup which is lower than the potential Vout and the potential Vin is applied to the upper electrode 224, the potential V1down which is lower than the potential Vup is applied to the lower electrode 226, and the potential V2down which is higher than the potential V1down and is sufficiently lower than the potential Vout and the potential Vin is applied to the lower electrode 227. By the application of such a potential, a plasma due to the Penning discharge can be generated in the space 14. At the same time, the movement of electrons of the space 14 in the up and down direction is also restricted.

Here, electrons gyrate around the magnetic field lines and the gyrating center moves in the circumferential direction due to the influence of the electric field and the magnetic field generated among the electrodes 224, 226, and 227 and the electrodes 220 and 222. This is called an E×B (e cross b) drift. The E×B drift is also caused by the electric field with the bias of the charge distribution in the plasma space 14. Further, even when the magnetic field line is curved, the gyrating center moves in the circumferential direction. When the magnetic field line is curved, the magnetic flux density also has a distribution and hence each contribution is called a curvature drift or a gradient B (bee) drift.

As the irradiation step (S106), the substrate 101 is irradiated with the short wavelength light (VUV light or soft X ray) radiated by the plasma generated in the space 14. In the example of FIG. 6, an opening portion is also formed in the retarding electrode 228 so that a passage is formed from the space 14 surrounded by the plurality of electrodes toward the irradiation position of the electron beam 200 of the substrate 101.

In the above-described example, a case has been described in which the outer electrode 220 and the inner electrode 222 are used to generate a plasma in the magnetic field at the outside of the passage region 12 of the electron beam 200 due to the Penning discharge, but the invention is not limited thereto.

Figure 12:
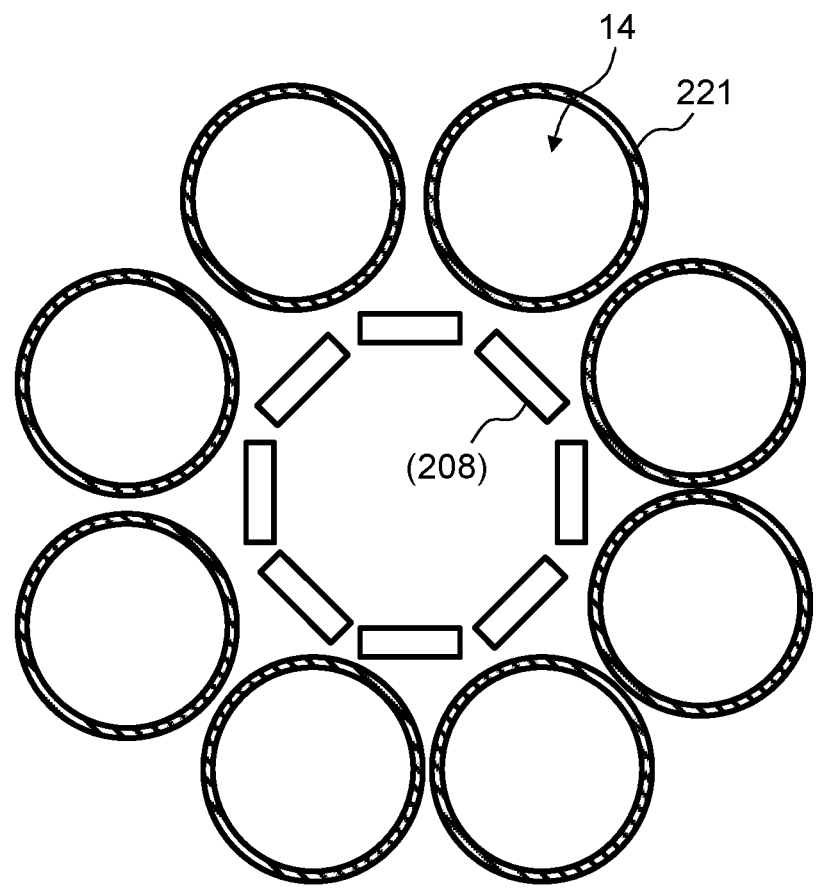
FIG. 12 is a plan view illustrating an example of a configuration in the vicinity of an objective lens of a modified example of Embodiment 1 as viewed from a height position between an upper electrode and a lower electrode.

FIG. 12 is a plan view illustrating an example of a configuration in the vicinity of an objective lens of a modified example of Embodiment 1 when viewed from a height position between the upper electrode and the lower electrode. In FIG. 12, a plurality of annular electrodes 221 are arranged in the circumferential direction instead of the outer electrode 220 and the inner electrode 222 of FIG. 6 in the magnetic field on the inside (the optical axis side) in relation to the coil 217 inside the pole piece 216 of the objective lens 207. Specifically, the plurality of cylindrical electrodes 221 are arranged in the circumferential direction in the outer peripheral space of the deflector 208. This configuration is the same as FIG. 6 in that the upper electrode 224 is disposed above the plurality of cylindrical electrodes 221 arranged in the circumferential direction and the lower electrodes 226 and 227 are disposed there below.

Thus, the inner space of each cylindrical electrode 221 is covered by the upper electrode 224 and the lower electrodes 226 and 227. In the example of FIG. 12, a plurality of electrodes such as the plurality of cylindrical electrodes 221, the upper electrode 224, and the lower electrodes 226 and 227 are disposed to divide the outer space of the passage region 12 of the electron beam 200 into the plurality of spaces 14 while individually surrounding the space. In such a configuration, a gas is supplied into each annular electrode 221.

As described above, according to Embodiment 1, it is possible to reduce the charging without influencing the magnetic field generated by the electromagnetic lens constituting the electron beam optics of the apparatus that emits the electron beam. As a result, a high-accuracy inspection can be performed.

Embodiment 2

In Embodiment 1, a case has been described in which a plasma is generated by the Penning discharge using the magnetic field of the electromagnetic lens, but a method of generating the plasma is not limited thereto. In Embodiment 2, a configuration of generating a plasma by a different method will be described. A configuration of the inspection apparatus 100 of Embodiment 2 is the same as that of FIG. 1. Further, a flowchart illustrating main steps of a charging reduction method of Embodiment 2 is the same as that of FIG. 11. Hereinafter, contents other than those specifically described may be the same as those in Embodiment 1.

Figure 13:
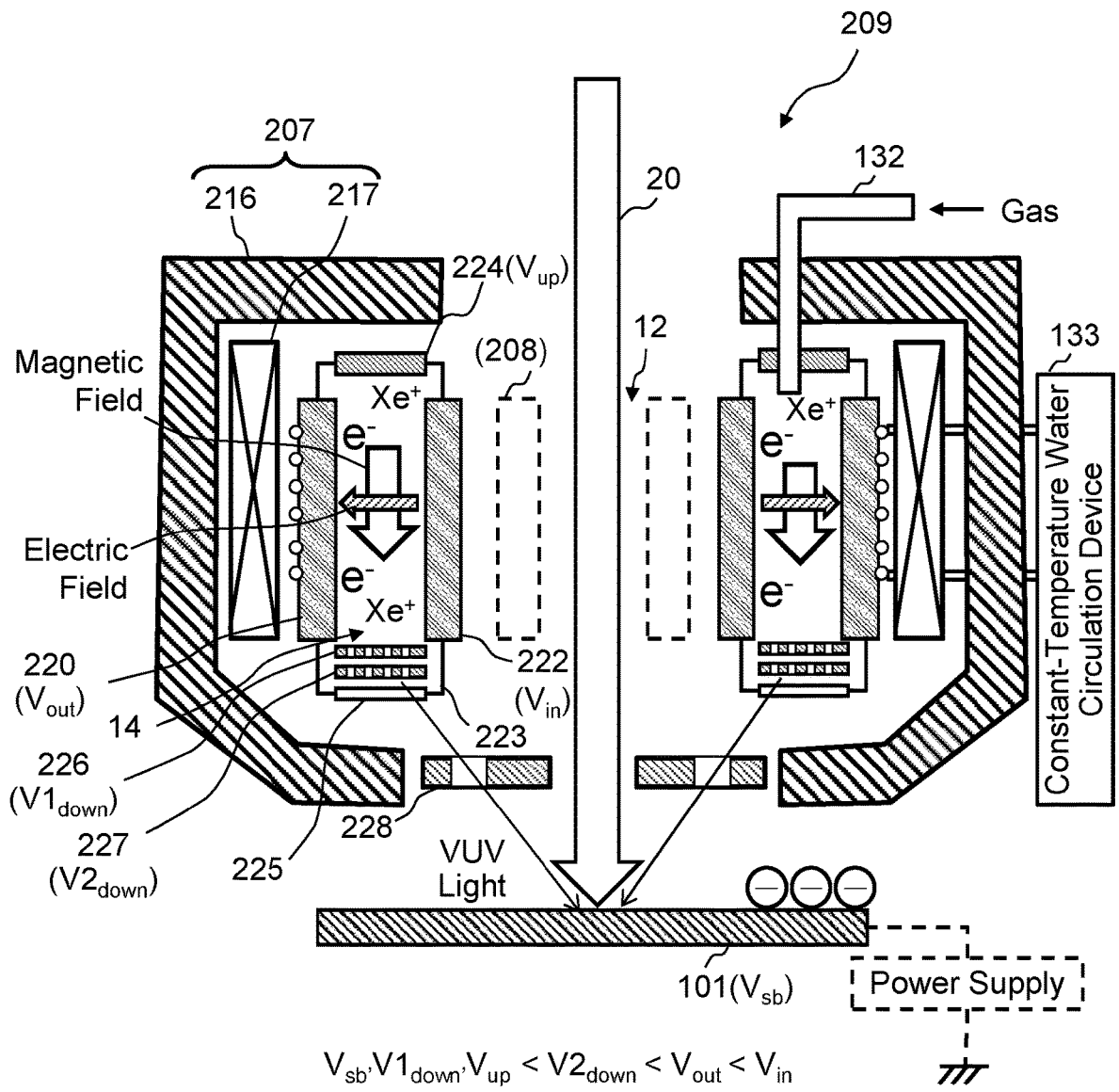
FIG. 13 is a cross-sectional view illustrating an example of a configuration in the vicinity of an objective lens of Embodiment 2.

FIG. 13 is a cross-sectional view illustrating an example of a configuration in the vicinity of an objective lens of Embodiment 2. FIG. 13 is the same as FIG. 6 except that an arrow indicating the direction of the electric field is added. A plan view illustrating a state in which a plurality of electrodes are arranged in Embodiment 2 when viewed from above the upper electrode is illustrated in FIG. 7. A plan view illustrating a state in which a plurality of electrodes are arranged in Embodiment 2 when viewed from an intermediate height position of the outer electrode is illustrated in FIG. 8. A plan view of the lower electrode of the plurality of electrodes of Embodiment 2 is illustrated in FIG. 9. In this way, the contents of the configuration in the vicinity of the objective lens are the same as those of Embodiment 1. However, a method of applying a potential to each electrode in the example of FIG. 13 is different. In Embodiment 2, a plasma is generated by a magnetron discharge. In order to start the discharge with high efficiency, a material such as a tungsten filament that emits thermal electrons by heating is provided in the vicinity of the upper electrode 224. Then, when a current is supplied from an external power supply to that material to heat the material, it is possible to start the discharge by emitting electrons. Even if the filament current is stopped after the discharge starts normally, the discharge continues.

The plasma control circuit 125 (the potential control unit) of Embodiment 2 controls the potentials of the plurality of electrodes so that a plasma is generated in the space 14 surrounded by a plurality of electrodes such as the outer electrode 220, the inner electrode 222, the upper electrode 224, and the lower electrodes 226 and 227 and the movement of positive ions or electrons and negative ions generated by the plasma is controlled. Specifically, the operation is as below. A plasma is generated in the space 14 which is in a vacuum state while being located in the magnetic field of the objective lens 207 and surrounded by a plurality of electrodes such as the outer electrode 220, the inner electrode 222, the upper electrode 224, and the lower electrodes 226 and 227. Here, such a plasma is generated by a magnetron discharge. In a state in which a strong length magnetic field is generated by the objective lens 207 in the space 14 surrounded by the outer electrode 220, the inner electrode 222, the upper electrode 224, and the lower electrodes 226 and 227, the plasma control circuit 125 applies the potential Vout to the outer electrode 220 and applies the potential Vin to the inner electrode 222 while flowing a predetermined gas from the gas supply line 132. In such a case, as the potential Vout of the outer electrode 220, a potential which is sufficiently lower than the potential Vin is applied. When the potential difference between the potential Vout of the outer electrode 220 and the potential Vin of the inner electrode 222 becomes higher than a predetermined potential difference, a plasma can be generated in the space 14 by the magnetron discharge. Further, the potential Vup which is lower than the potential Vout and the potential Vin is applied to the upper electrode 224 and the potential V1down which is lower than the potential Vout and the potential Vin is also applied to the lower electrode 226. Similarly, the positive potential V2down which is lower than the potential Vout and the potential Vin and is higher than the potential V1down is also applied to the lower electrode 227. For example, a magnetic field of 4 to 6 kG is generated by the objective lens 207. In such a magnetic field, for example, 2.2 kV is applied as the potential Vin. As the potential Vout, for example, 200 V is applied. As the potential Vup, a potential which is lower than the potential Vout, for example, 0 V is applied. As the potential V1down, a potential which is lower than the potential Vout, for example, 0 V is applied. As the potential V2down, a positive potential which is lower than the potential Vout and is higher than the potential V1down, for example, 200 V is applied. Due to this effect, trapped electrons ionize the gas molecules supplied from the gas supply line 132 to generate ions (for example, positive ions Xe$^+$). Then, light (VUV light or soft X-ray) due to the plasma is radiated along with the generation.

Figure 14:
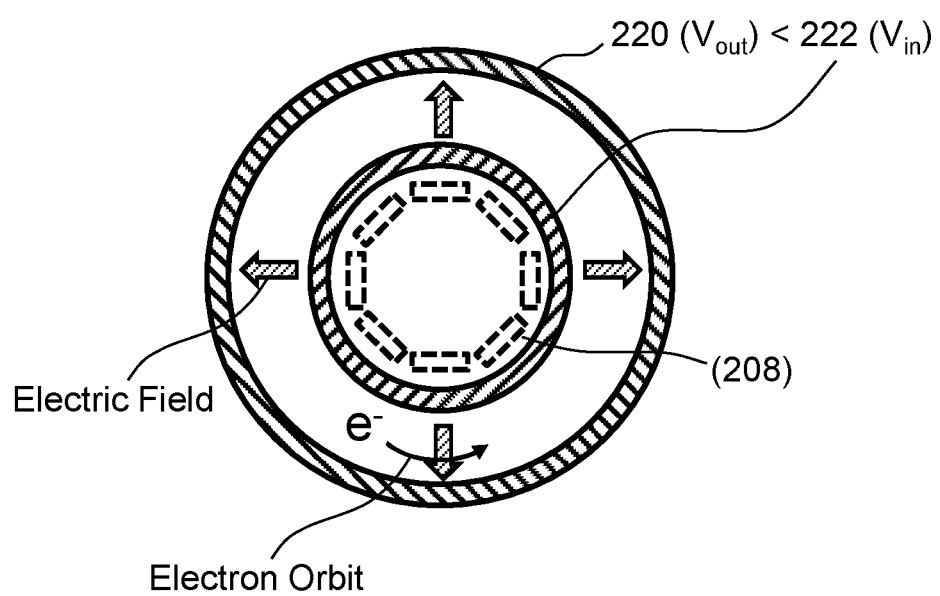
FIG. 14 is a diagram for describing an electric field and an electron orbit of Embodiment 2.

FIG. 14 is a diagram for describing an electric field and an electron orbit of Embodiment 2. In FIG. 14, in Embodiment 2, since a potential difference is generated between the potential Vout of the outer electrode 220 and the potential Vin of the inner electrode 222, an electric field is generated from the outer electrode 220 toward the inner electrode 222. Such an electric field is formed in a direction orthogonal to the direction of the magnetic field generated by the objective lens 207. The movement of the electrons (e$^-$) in the space 14 in the radial direction is restricted by a strong length magnetic field generated by the objective lens 207. Further, when the potential Vup which is lower than the potential Vout and the potential Vin is applied to the upper electrode 224 and the potential V1down which is lower than the potential Vout and the potential Vin is applied to the lower electrode 226, the movement of the electrons of the space 14 in the up and down direction is also restricted. Further, when the positive potential V2down which is lower than the potential Vout and is higher than the potential V1down is applied to the lower electrode 227, the positive ions of the space 14 are repelled into the space 14. Such a point is the same as that of the Penning discharge. However, in a case in which the collision can be ignored, the turning center of the electrons (e$^-$) in the space 14 rotates in the circumferential direction in the annular space 14 between the outer electrode 220 and the inner electrode 222 due to the combination effect between the electric field and the magnetic field in addition to the rammer rotation in the magnetic field. This phenomenon is called an E×B drift. For that reason, the plasma generated by the magnetron discharge is more uniform than the plasma generated by the Penning discharge in the annular space 14 between the outer electrode 220 and the inner electrode 222. Furthermore, an E×B drift also occurs due to the electric field generated among the electrodes 220 and 222 and the electrodes 224, 226, and 227. Further, in a case in which the magnetic field line is curved, a curvature drift and a gradient B also occur. Further, the E×B drift is also caused by the electric field in accordance with the bias of the charge distribution in the plasma.

As described above, in Embodiment 2, when a plurality of electrodes such as the outer electrode 220, the inner electrode 222, the upper electrode 224, and the lower electrodes 226 and 227 are arranged in the magnetic field of the objective lens 207 and predetermined potentials are respectively applied thereto, it is possible to radiate light (VUV light or soft X-ray) due to the plasma and to generate ions (for example, positive ions $Xe^+$) and electrons ($e^-$) due to the plasma by the magnetron discharge in the space 14 surrounded by the plurality of electrodes. Similarly to Embodiment 1, the ions (for example, positive ions $Xe^+$) and electrons ($e^-$) are repelled into the space 14 by the lower electrodes 226 and 227 and the generated short wavelength light (VUV light or soft X ray) is emitted to the substrate 101 while being transmitted through the transmission window 225. By using such a short wavelength light (VUV light or soft X ray), the charging of the substrate 101 is reduced (or eliminated). In Embodiment 2, it is possible to reduce or eliminate the uneven distribution of ions (for example, positive ions $Xe^+$) and electrons ($e^-$) in the annular space 14 by using the magnetron discharge. Thus, it is possible to improve the uniformity of the light amount in a case in which radiated light is emitted toward the substrate 101.

Then, as the irradiation step (S106), the substrate 101 is irradiated with short wavelength light (VUV light or soft X ray) from the plasma space 14. In the example of FIG. 12, an opening portion is also formed in the retarding electrode 228 so as to form a passage from the space 14 surrounded by the plurality of electrodes toward the irradiation position of the electron beam 200 of the substrate 101 similarly to FIG. 6.

As described above, in Embodiment 2, it is possible to reduce or eliminate the charging due to the short wavelength light even when the surface of the substrate 101 is charged positively or negatively similarly to Embodiment 1. In this way, in Embodiment 2, this method can be applied regardless of the charged state.

Figure 15:
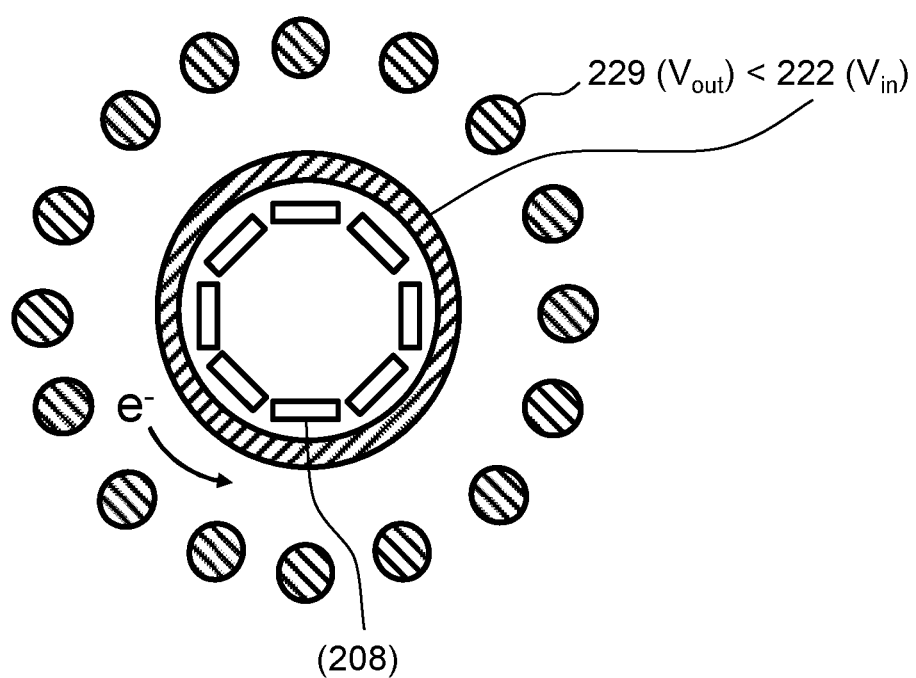
FIG. 15 is a plan view illustrating an example of a configuration in the vicinity of an objective lens of a modified example of Embodiment 2 as viewed from a height position between an upper electrode and a lower electrode.

FIG. 15 is a plan view illustrating an example of a configuration in the vicinity of an objective lens of a modified example of Embodiment 2 when viewed from a height position between the upper electrode and the lower electrode. In FIG. 15, a plurality of cylindrical electrodes 229 are arranged in the circumferential direction in the magnetic field on the inside (the optical axis side) in relation to the coil 217 in the pole piece 216 of the objective lens 207, instead of the outer electrode 220 of FIG. 13. Specifically, a plurality of cylindrical electrodes 229 are arranged in the circumferential direction in the outer peripheral space of the inner electrode 222. This configuration is the same as that of FIG. 13 in that the upper electrode 224 is disposed above the plurality of cylindrical electrodes 229 arranged in the circumferential direction and the lower electrodes 226 and 227 are disposed therebelow. In the example of FIG. 15, a plurality of electrodes such as the plurality of cylindrical electrodes 229, the inner electrode 222, the upper electrode 224, and the lower electrodes 226 and 227 are arranged to surround the outer space 14 of the passage region 12 of the electron beam 200. In the example of FIG. 15, the plurality of cylindrical electrodes 229 are sealed from each other by a sealing wall (not illustrated).

The plasma control circuit 125 (the potential control unit) controls the potentials of a plurality of electrodes such as the plurality of cylindrical electrodes 229, the inner electrode 222, the upper electrode 224, and the lower electrodes 226 and 227 so that a plasma is generated in the space 14 surrounded by the plurality of electrodes and the movement of positive ions or electrons and negative ions generated by the plasma is controlled. Specifically, the operation is as below. A plasma generated by the magnetron discharge is generated in the space 14 which is in a vacuum state while being surrounded by a plurality of electrodes such as the plurality of cylindrical electrodes 229, the inner electrode 222, the upper electrode 224, and the lower electrodes 226 and 227 by using the magnetic field of the objective lens 207 and the plurality of electrodes such as the plurality of cylindrical electrodes 229, the inner electrode 222, the upper electrode 224, and the lower electrodes 226 and 227. In a state in which a strong length magnetic field is generated by the objective lens 207, the plasma control circuit 125 applies the positive potential Vout to all of the plurality of cylindrical electrodes 229 while flowing a predetermine gas from the gas supply line 132. The potentials of the other electrodes are the same as those of FIG. 13. Accordingly, an electric field is generated from each cylindrical electrode 229 toward the inner electrode 222. Thus, it is possible to generate a plasma by the magnetron discharge similarly to FIG. 13.

As described above, according to Embodiment 2, it is possible to generate a plasma by the magnetron discharge without influencing the magnetic field generated by the electromagnetic lens (for example, the projection lens 204 and the objective lens 207) constituting the electron beam optics of the apparatus emitting the electron beam 200. For that reason, it is possible to radiate light by the plasma and to reduce the charging of the substrate 101. As a result, a high-accuracy inspection can be performed.

Embodiment 3

In Embodiment 3, a configuration capable of improving the efficiency of emitting light to a desired position of the substrate 101 as compared with the above-described embodiments will be described.

Figure 16:
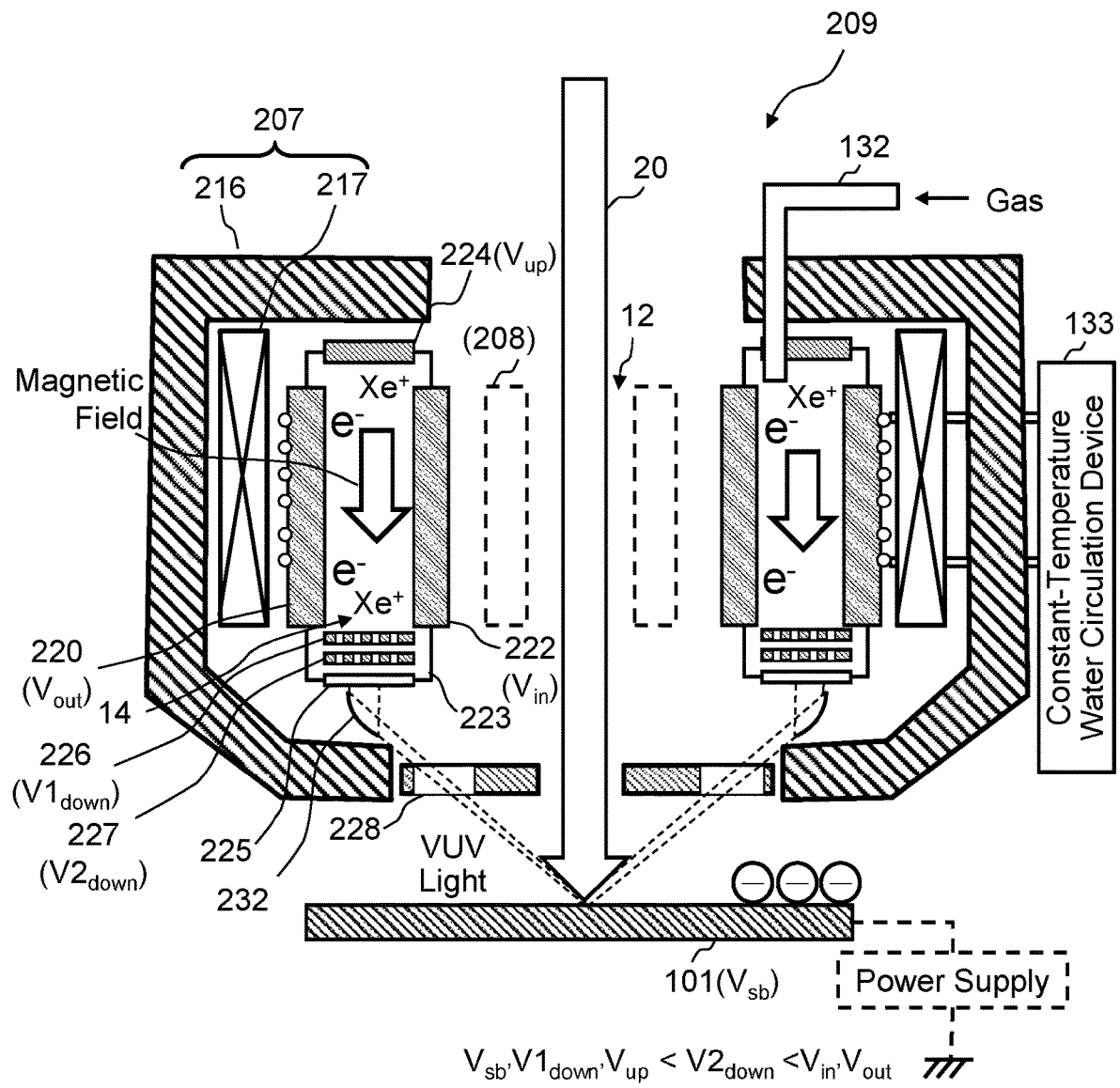
FIG. 16 is a cross-sectional view illustrating an example of a configuration of a plasma generation mechanism in an objective lens of Embodiment 3.

FIG. 16 is a cross-sectional view illustrating an example of a configuration of a plasma generation mechanism in an objective lens of Embodiment 3. FIG. 16 is the same as FIG. 6 except that a mirror 232 having a concave reflection surface is disposed below the transmission window 225 in the pole piece 216. The mirror 232 focuses light radiated by the plasma and transmitted through the transmission window 225 to a desired position of the substrate 101. Accordingly, it is possible to efficiently irradiate light to an irradiation position of the multiple beams 20. The other contents are the same as those of Embodiment 1.

Furthermore, in the example of FIG. 16, a configuration of the Penning discharge is illustrated, but the invention is not limited thereto. It is needless to say that this configuration can be also applied to the configuration of the magnetron discharge illustrated in Embodiment 2.

Embodiment 4

In the above-described embodiments, a case has been described in which a length magnetic field is generated by the objective lens 207 and a plasma is generated by using such a length magnetic field. However, the magnetic field generation direction is not limited thereto. A configuration of the inspection apparatus 100 of Embodiment 4 is the same as that of FIG. 1 except for a configuration of an objective lens and a configuration of a plurality of electrodes surrounding a plasma space to be described later. Further, a flowchart illustrating main steps of a charging reduction method of Embodiment 4 is the same as that of FIG. 11. Further, contents other than those specifically described may be the same as those in Embodiments 1 to 3.

Figure 17:
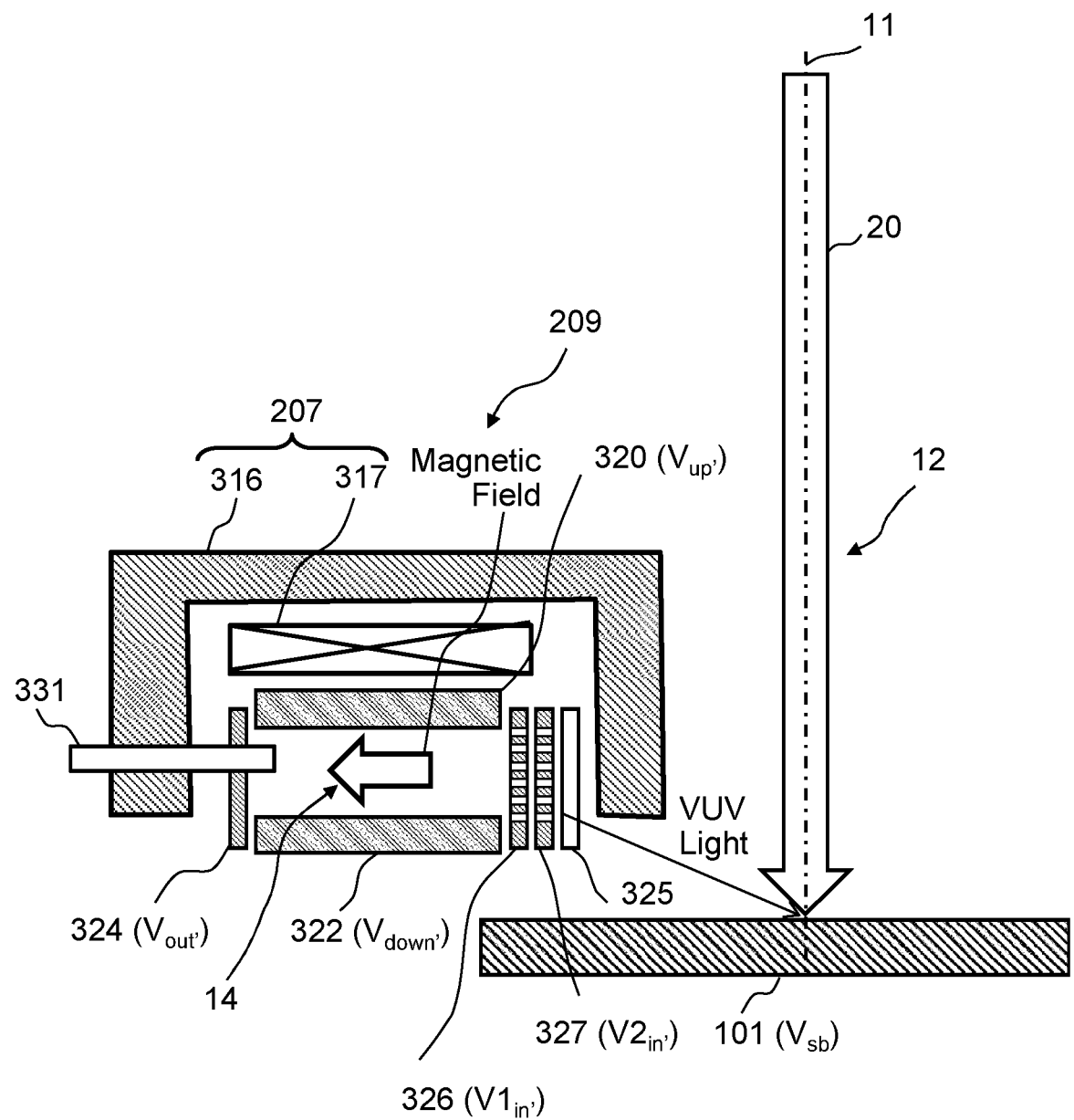
FIG. 17 is a cross-sectional view illustrating an example of a configuration of a plasma generation mechanism in an objective lens of Embodiment 4.

FIG. 17 is a cross-sectional view illustrating an example of a configuration of a plasma generation mechanism in an objective lens of Embodiment 4. As described above, electromagnetic lenses such as the illumination lens 202, the projection lens 204, and the objective lens 207 include a coil which is disposed to surround the optical axis of the electron beam 200 and a pole piece (a yoke) which surrounds the coil and the pole piece (the yoke) is provided with an open portion (hereinafter, referred to as a space or a gap) that leaks a high-dense magnetic field line generated by the coil toward the optical axis of the multiple beams 20 (or the electron beam 200). Here, the objective lens 207 will be described as an example. In FIG. 17, the objective lens 207 includes a pole piece (a yoke) 316 and a coil 317. The pole piece 316 is formed to be elongated in the vertical direction (to be elongated in the radial direction orthogonal to the optical axis) and the coil 317 which is elongated in the vertical direction is disposed therein. The pole piece 316 is formed so that the center portion of the upper surface is opened to secure the passage region of the multiple beams 20 and the lower surface is opened (an opening portion is formed). The coil 317 is disposed at a position near the upper side in a space surrounded at the upper surface and the outer and inner peripheral side surfaces by the pole piece 316 in three directions. When a current flows to the coil 317 in such a state, the coil 317 generates a magnetic field line in a direction orthogonal to the traveling direction (the outward radial direction of FIG. 17) of the multiple beams 20 in the lower space of the coil 317. The example of FIG. 17 illustrates a cross-section on the left hand side of the optical axis 11 of the multiple beams 20 as an example. In such a cross-section, a magnetic field line generated by the coil 317 rotates right in the pole piece 316. Then, a loop of the magnetic field line traveling from the inner peripheral lower end of the pole piece 316 to the outer peripheral lower end thereof through a lower open space is formed. Although not illustrated in the drawings, in a cross-section on the right hand side of the optical axis 11 of the electron beam 200, a magnetic field line generated by the coil 317 rotates left in the pole piece 316. Then, a loop of the magnetic field line traveling from the inner peripheral lower end of the pole piece 316 to the outer peripheral lower end thereof through a lower open space is formed. As described above, a magnetic field is generated in a direction (the outward radial direction of FIG. 17) orthogonal to the traveling direction of the electron beam 200 of the space on the lower side (the substrate side) in relation to the coil 317. Therefore, in Embodiment 4, light (VUV light or soft X-ray) is generated by generating a plasma using a lateral magnetic field generated in the space on the lower side (the substrate side) in relation to such a coil 317.

In FIG. 17, a plurality of electrodes such as the upper electrode 320, the lower electrode 322, the outer electrode 324, and the inner electrodes 326 and 327 are arranged in the magnetic field on the lower side (the substrate side) in relation to the coil 317 in the pole piece 316 of the objective lens 207. As illustrated in FIG. 17, a plurality of electrodes such as the upper electrode 320, the lower electrode 322, the outer electrode 324, and the inner electrodes 326 and 327 are arranged to surround the outer space 14 of the passage region 12 of the multiple beams 20. The inner electrodes 326 and 327 are formed in a grid shape so that light can pass therethrough. Further, the transmission window 325 is disposed on the optical axis side of the inner electrode 327.

The plasma control circuit 125 (the potential control unit) of Embodiment 4 controls the potentials of the plurality of electrodes so that a plasma is generated in the space 14 surrounded by a plurality of electrodes such as the upper electrode 320, the lower electrode 322, the outer electrode 324, and the inner electrodes 326 and 327 and the movement of positive ions or electrons and negative ions generated by the plasma is controlled. Specifically, the operation is as below. A plasma is generated in the space 14 which is in a vacuum state while being surrounded by a plurality of electrodes such as the upper electrode 320, the lower electrode 322, the outer electrode 324, and the inner electrodes 326 and 327 by using the magnetic field of the objective lens 207 and the plurality of electrodes such as the upper electrode 320, the lower electrode 322, the outer electrode 324, and the inner electrodes 326 and 327.

In a case in which such a plasma is generated by, for example, the Penning discharge, the potential is applied as below. In a state in which a strong lateral magnetic field is generated by the objective lens 207 in the space 14, the plasma control circuit 125 applies the potential Vup' to the upper electrode 320 and applies the potential Vdown' to the lower electrode 322 while flowing a predetermined gas from the gas supply line 132 disposed to pass through the outer electrode 324. In such a case, a positive same potential is applied as the potential Vup' of the upper electrode 320 and the potential Vdown' of the lower electrode 322. When the potential Vup' of the upper electrode 320 and the potential Vdown' of the lower electrode 322 become higher than the potentials of the potential Vout' of the outer electrode 324 and the potential Vin' of the inner electrode 326 by a predetermined potential, a plasma can be generated in the space 14 by the Penning discharge. The movement of electrons ($e^-$) in the space 14 in the up and down direction is restricted by a strong lateral magnetic field. The potential Vout' which is lower than the potential Vup' and the potential Vdown' is applied to the outer electrode 324, the potential V1in ' which is lower than the potential Vup' and the potential Vdown' is applied to the inner electrode 326, and the positive potential V2in ' which is lower than the potential Vup' and the potential Vdown' and is higher than the potential V1in ' is applied to the inner electrode 327, so that the movement of electrons of the space 14 in the radial direction is restricted. By the objective lens 207, for example, a magnetic field of 4 to 6 kG is generated. In such a magnetic field, for example, 2.1 kV is applied as the potential Vup'. As the potential Vdown', for example, a potential of 2.1 kV which is the same as the potential Vup' is applied. As the potential Vout', a potential, for example, 0 V which is lower than the potential Vdown' is applied. As the potential V1in ', a potential, for example, 0 V which is lower than the potential down' is applied. As the potential V2in ', a positive potential, for example, 100 V which is higher than the potential V1in ' is applied. Due to this effect, trapped electrons ionize the gas molecules supplied from the gas supply line 132 to generate ions (for example, positive ions $Xe^+$). In order to start the discharge with high efficiency, a material such as a tungsten filament that emits thermal electrons by heating is provided in the vicinity of the outer electrode 324. Then, when a current is supplied from an external power supply to that material to heat the material, it is possible to start the discharge by emitting electrons. Even if the filament current is stopped after the discharge starts normally, the discharge continues.

In a case in which such a plasma is generated by, for example, the magnetron discharge, a potential which is sufficiently higher than the potential Vup' of the upper electrode 320 is applied as the potential Vdown' of the lower electrode 322. For example, 2.2 kV is applied as the potential Vdown' and 200 V, 200 V, 0 V, and 0 V are respectively applied as the potentials Vup', V2in ', V1in ', and Vout'. When a difference between the potential Vup' of the upper electrode 320 and the potential Vdown' of the lower electrode 322 becomes higher than a predetermined potential difference, a plasma can be generated by the magnetron discharge in the space 14. Due to this effect, trapped electrons ionize the gas molecules supplied from the gas supply line 132 to generate ions (for example, positive ions $Xe^+$). In order to start the discharge with high efficiency, a material such as a tungsten filament that emits thermal electrons by heating is provided in the vicinity of the outer electrode 324. Then, when a current is supplied from an external power supply to that material to heat the material, it is possible to start the discharge by emitting electrons. Even if the filament current is stopped after the discharge starts normally, the discharge continues.

Then, as a radiation step (S106), light (VUV light or soft X-ray) generated in the plasma space 14 by the plasma due to such a Penning discharge (or the magnetron discharge) is caused to pass through the inner electrodes 326 and 327, to be transmitted through the transmission window 325, and to be emitted to the substrate 101.

As described above, according to Embodiment 4, it is possible to generate a plasma by the Penning discharge or the magnetron discharge without influencing such a magnetic field even when the magnetic field generated by the electromagnetic lens (for example, the projection lens 204 and the objective lens 207) constituting the electron beam optics of the apparatus emitting the multiple beams 20 is the lateral magnetic field in the radial direction. For that reason, it is possible to generate VUV light or soft X-ray having a short wavelength by the plasma and to reduce the charging of the substrate 101. As a result, a high-accuracy inspection can be performed.

In the description above, a series of "circuits" include a process circuit and the process circuit includes an electric circuit, a computer, a processor, a circuit board, a quantum circuit, or a semiconductor device. Further, each "circuit" may use a common process circuit (the same process circuit). Alternatively, a different process circuit (a separate process circuit) may be used. A program that executes a processor or the like may be recorded on a record carrier body such as a magnetic disk drive, a magnetic tape device, an FD, or a read only memory (ROM). For example, the position circuit 107, the comparison circuit 108, the reference image creation circuit 112, the mark position measurement circuit 130, the delay time table creation circuit 132, the tracking position calculation circuit 134 (434), and the correction circuit 136 (436) may be configured as at least one process circuit.

As described above, embodiments have been described with reference to detailed examples. However, the invention is not limited to these detailed examples. In the above-described examples, a case in which one deflector 208 is disposed as the objective deflector has been described, but the invention is not limited thereto. For example, a plurality of deflectors having different deflection regions may be arranged.

Further, instead of forming images of the plurality of holes 22 provided in the shaping aperture array substrate 203 on the target object surface, a method of forming an array corresponding to an electrostatic lens array of images of virtual electron sources obtained by arranging the shaping aperture array substrates 203, for example, three aperture array substrates each having a circular aperture shape in the traveling direction of the electron beam, applying a voltage to the aperture array substrates located at the front and rear sides of the center aperture array substrate, and focusing the electron beam passing through the aperture on the target object surface can be also employed.

Further, although a part which is not directly necessary in the description of the invention, such as an apparatus configuration or a control technique has not been described, an apparatus configuration or a control technique can be appropriately selected and used when necessary.

In addition, all pattern inspection apparatuses and pattern inspection methods that include the components of the invention and can be appropriately designed and changed by those skilled in the art are included in the scope of the invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam irradiation apparatus comprising:
   an emission source configured to emit a charged particle beam;
   an electromagnetic lens configured to refract the charged particle beam;
   a plurality of electrodes arranged in a magnetic field of the electromagnetic lens and arranged to surround an outer space of a passage region of the charged particle beam;
   a supply mechanism configured to supply a gas to the space surrounded by the plurality of electrodes;
   a potential control circuit configured to control potentials of the plurality of electrodes so that a plasma is generated in the space surrounded by the plurality of electrodes and movements of electrons or positive ions generated by the plasma are controlled; and
   a stage configured to dispose a substrate irradiated with a charged particle beam passing through the electromagnetic lens,
   wherein the substrate is irradiated with light radiated by the plasma.

2. The apparatus according to claim 1,
   wherein the plasma is generated by a magnetron discharge.

3. The apparatus according to claim 1,
   wherein the plasma is generated by a Penning discharge.

4. The apparatus according to claim 1, further comprising:
   a high frequency wave generation mechanism configured to generate a high frequency wave heating the plasma inside the space.

5. The apparatus according to claim 1, further comprising:
   a mirror configured to focus light radiated by the plasma to the substrate.

6. The apparatus according to claim 1,
wherein an electron beam is used as the charged particle beam.

7. The apparatus according to claim 6,
wherein multiple electron beams are used as the electron beam,
the apparatus further comprising a shaping aperture array substrate configured to form the multiple electron beams.

8. The apparatus according to claim 7,
wherein an objective lens focusing the multiple electron beams to the substrate is used as the electromagnetic lens.

9. A charged particle beam image acquisition apparatus comprising:
   an emission source configured to emit a charged particle beam;
   a stage configured to dispose a substrate thereon;
   an electromagnetic lens configured to refract the charged particle beam;
   a plurality of electrodes arranged in a magnetic field of the electromagnetic lens and arranged to surround an outer space of a passage region of the charged particle beam;
   a supply mechanism configured to supply a gas to the space surrounded by the plurality of electrodes;
   a potential control circuit configured to control potentials of the plurality of electrodes so that a plasma is generated in the space surrounded by the plurality of electrodes and movements of electrons or positive ions generated by the plasma are controlled; and
   a detector configured to detect a secondary electron beam emitted from the substrate due to an irradiation of the charged particle beam passing through the electromagnetic lens while the substrate is irradiated with light radiated by the plasma.

10. A charged particle beam inspection apparatus comprising:
    an emission source configured to emit a charged particle beam;
    a stage configured to dispose a substrate thereon;
    an electromagnetic lens configured to refract the charged particle beam;
    a plurality of electrodes arranged in a magnetic field of the electromagnetic lens and arranged to surround an outer space of a passage region of the charged particle beam;
    a supply mechanism configured to supply a gas to the space surrounded by the plurality of electrodes;
    a potential control circuit configured to control potentials of the plurality of electrodes so that a plasma is generated in the space surrounded by the plurality of electrodes and movements of electrons or positive ions generated by the plasma are controlled;
    a detector configured to detect a secondary electron beam emitted from the substrate due to an irradiation of the charged particle beam passing through the electromagnetic lens while the substrate is irradiated with light radiated by the plasma; and
    a comparison circuit configured to compare a secondary electron image obtained by a detected secondary electron beam with a reference image.

* * * * *